(12) United States Patent
Taketani

(10) Patent No.: US 7,910,988 B2
(45) Date of Patent: Mar. 22, 2011

(54) SEMICONDUCTOR DEVICE AND MANUFACTURING METHOD THEREFOR

(75) Inventor: Hiroaki Taketani, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 129 days.

(21) Appl. No.: 12/396,517

(22) Filed: Mar. 3, 2009

(65) Prior Publication Data

US 2009/0224312 A1  Sep. 10, 2009

(30) Foreign Application Priority Data

Mar. 5, 2008  (JP) .................................. 2008-055104

(51) Int. Cl.
H01L 29/76 (2006.01)
H01L 29/94 (2006.01)
H01L 31/062 (2006.01)
H01L 31/113 (2006.01)
H01L 31/119 (2006.01)

(52) U.S. Cl. ......................... 257/330; 257/331; 257/334

(58) Field of Classification Search ........... 257/330–334
See application file for complete search history.

(56) References Cited

U.S. PATENT DOCUMENTS
2009/0230464 A1 *  9/2009  Taketani ........................ 257/330

FOREIGN PATENT DOCUMENTS
JP  2007-158269  6/2007
JP  2007-258660  10/2007

\* cited by examiner

*Primary Examiner* — Thien F Tran
(74) *Attorney, Agent, or Firm* — Young & Thompson

(57) ABSTRACT

A semiconductor device including a trench-gate MOS transistor on a semiconductor substrate is constituted of a trench formed in an active region, a fin channel region formed between a separation region and the trench in the active region, a first gate electrode embedded in the separation region in connection with the fin channel region via a first gate insulating film, a second gate electrode embedded in the trench in connection with the fin channel region via a second gate insulating film, and a source-drain diffusion region disposed beside the trench in the active region below the second gate electrode.

11 Claims, 34 Drawing Sheets

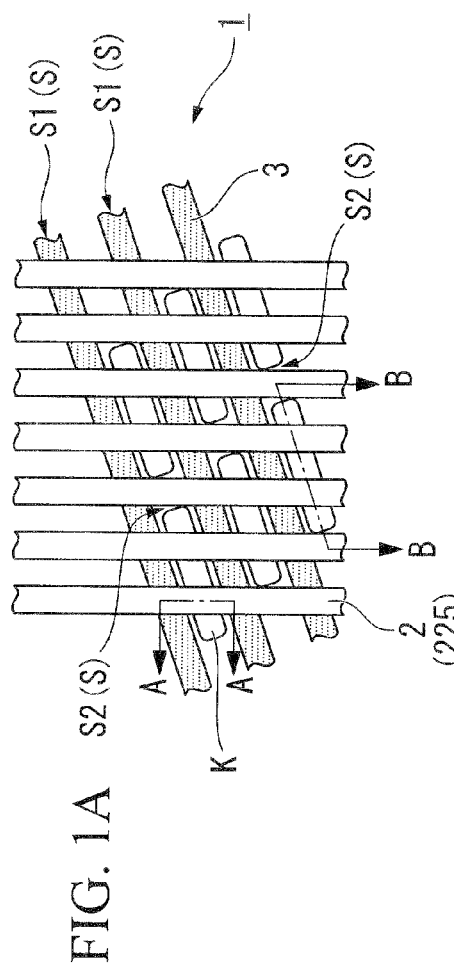
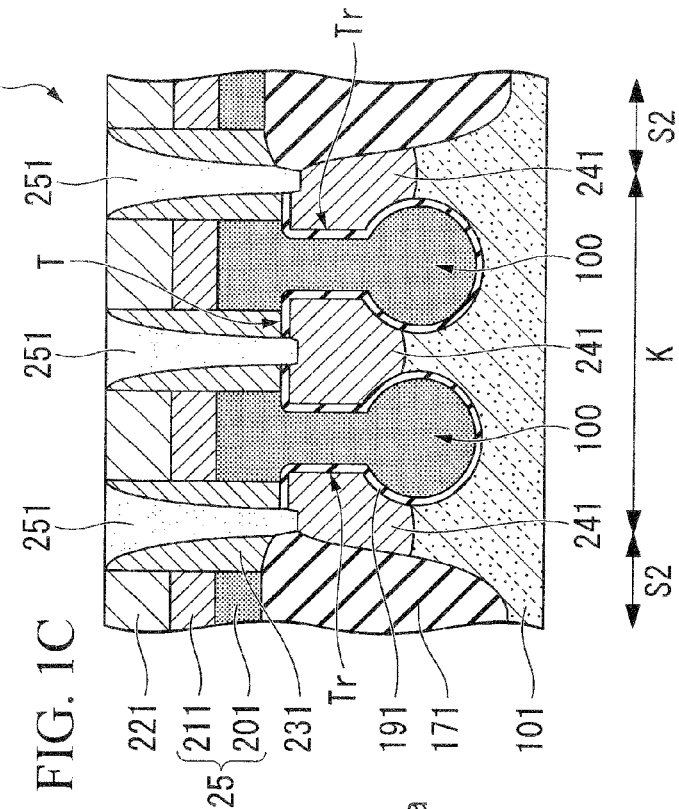
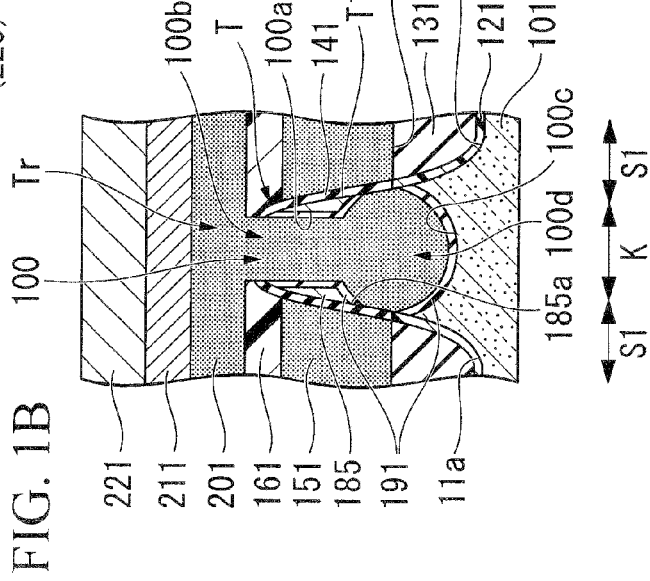

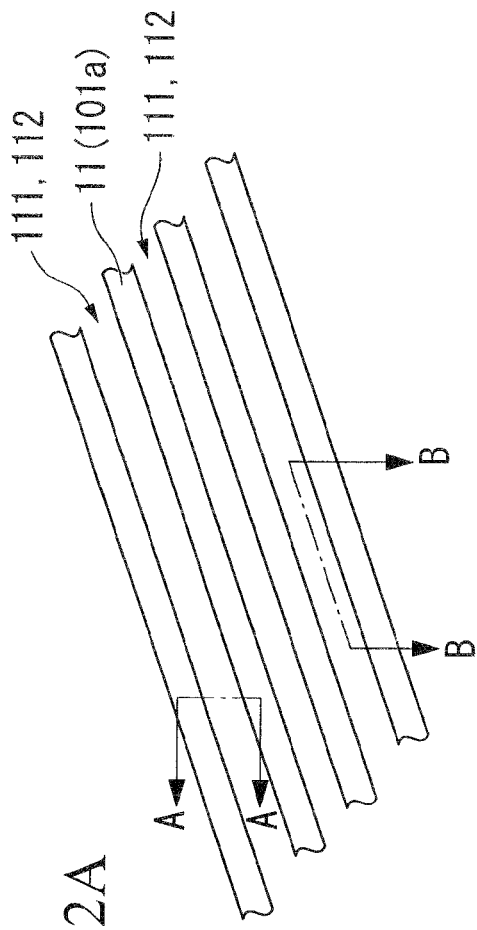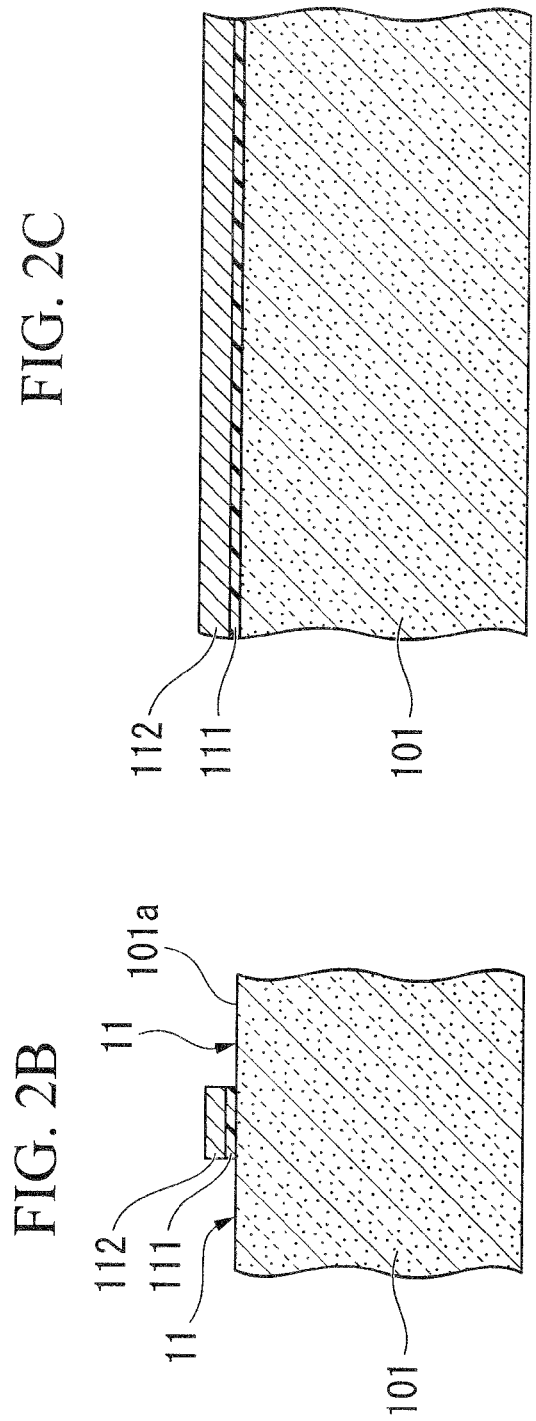

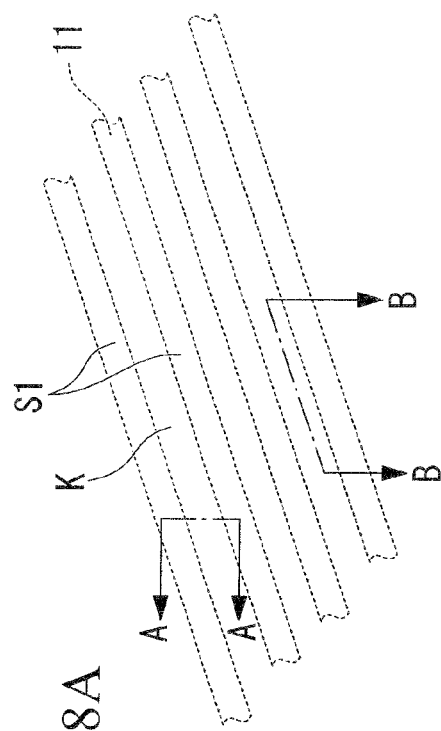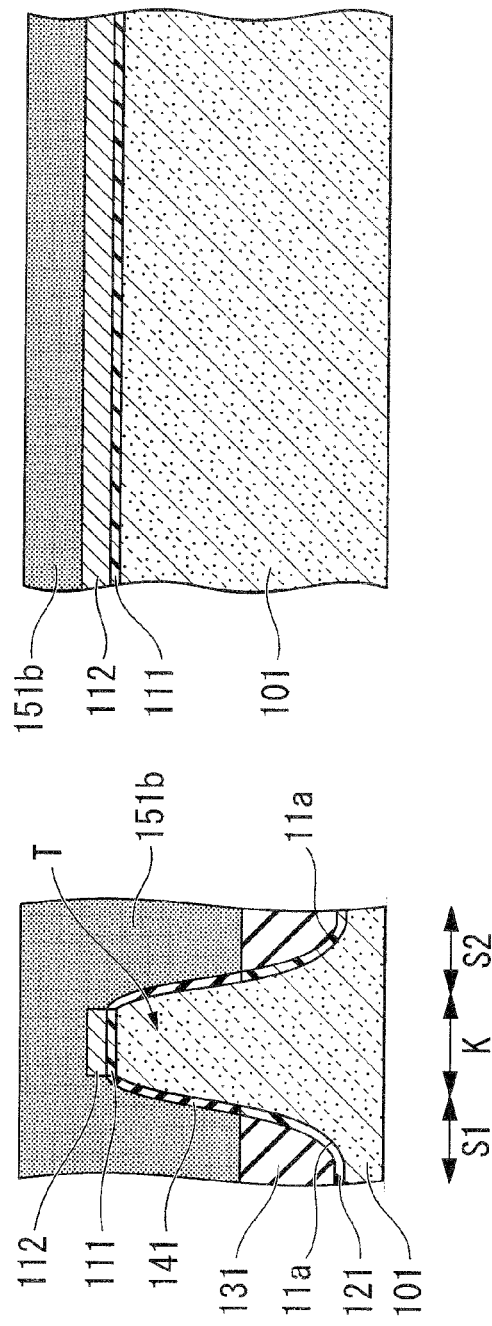

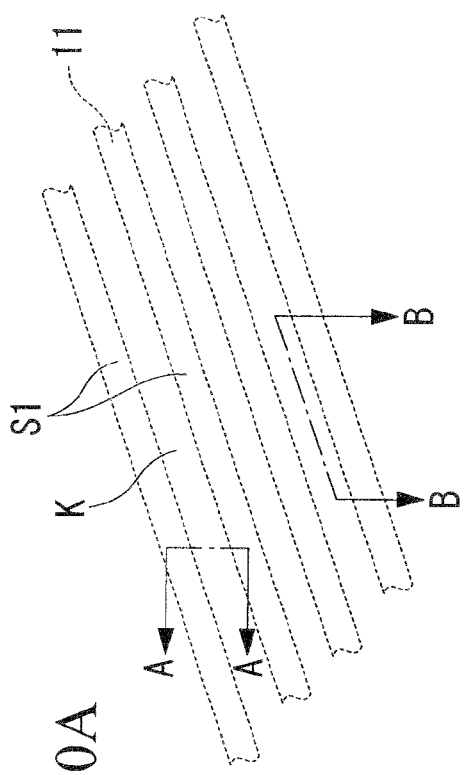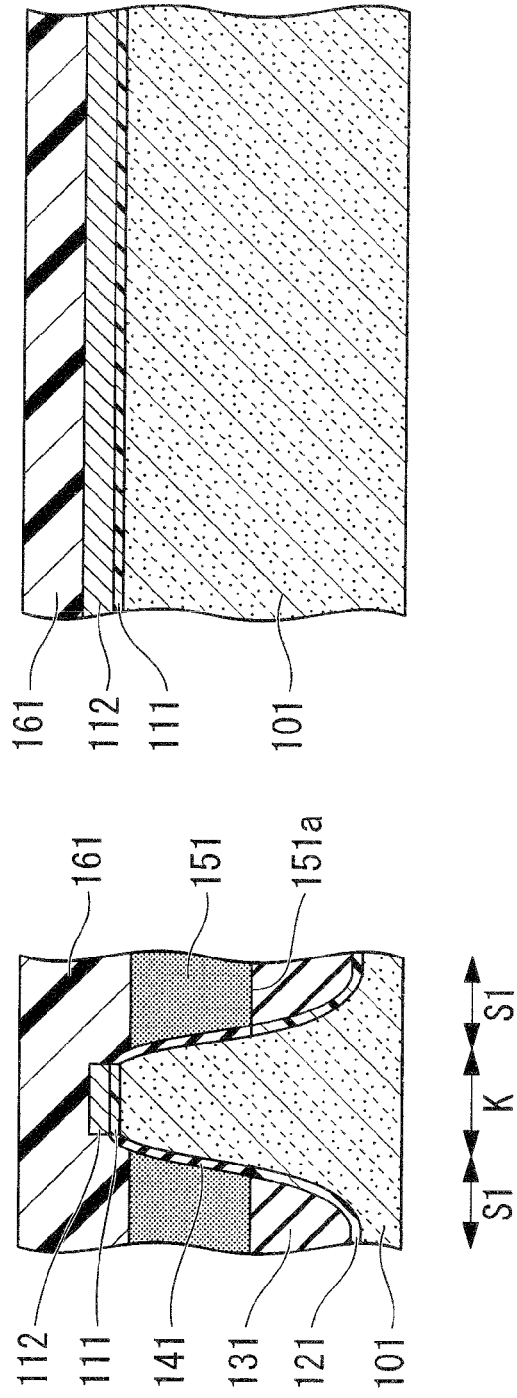

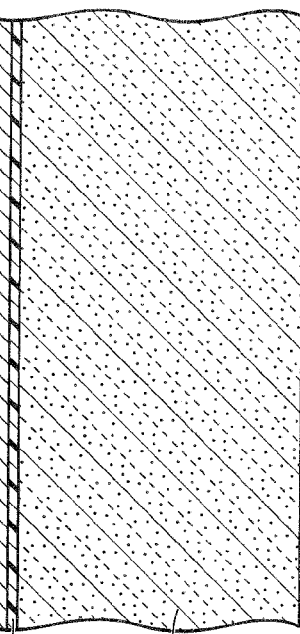
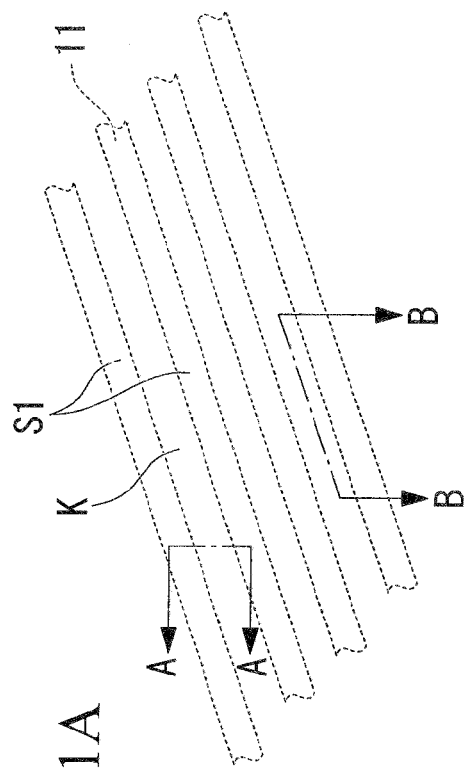
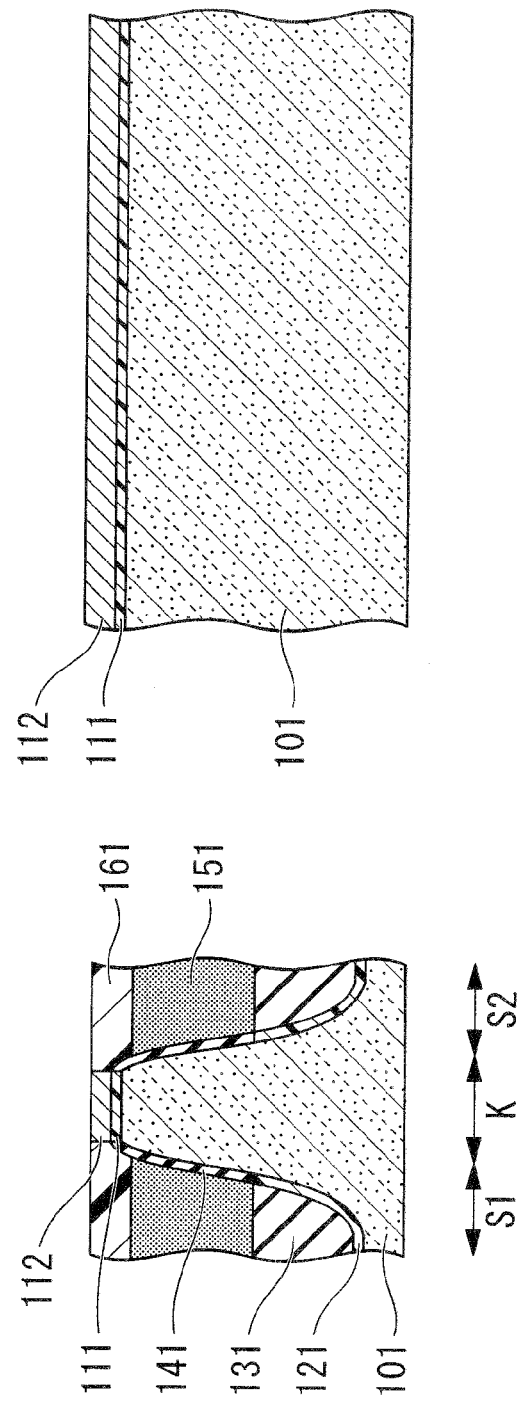

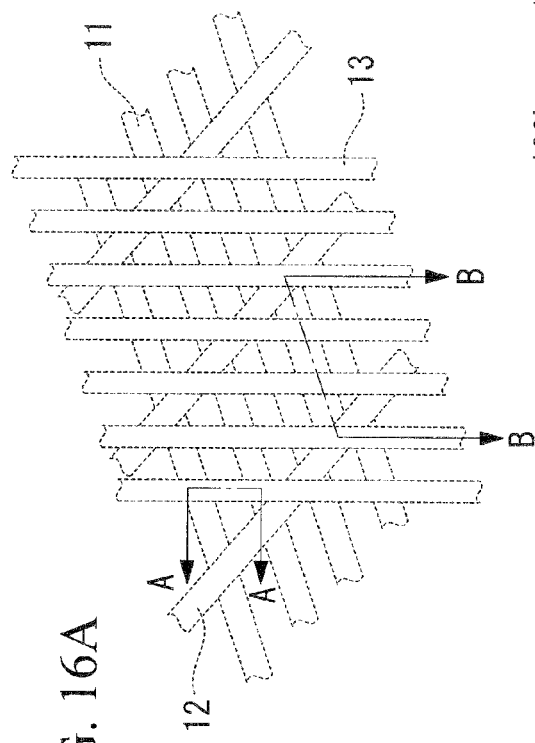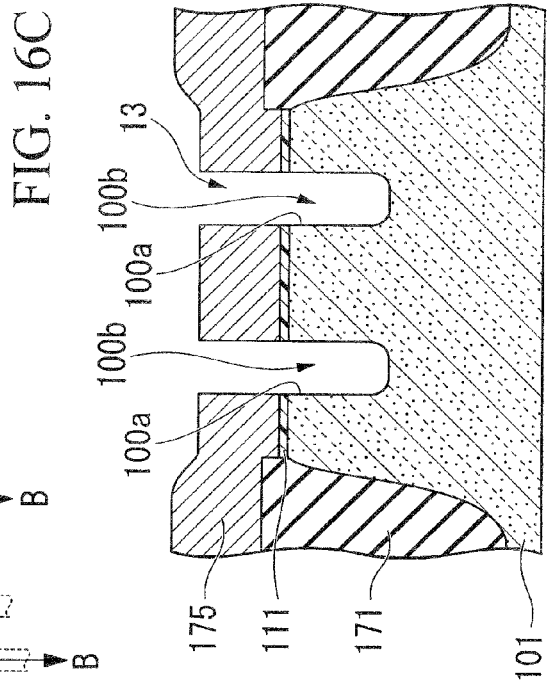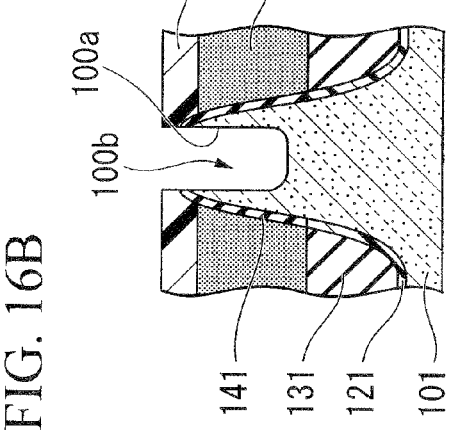

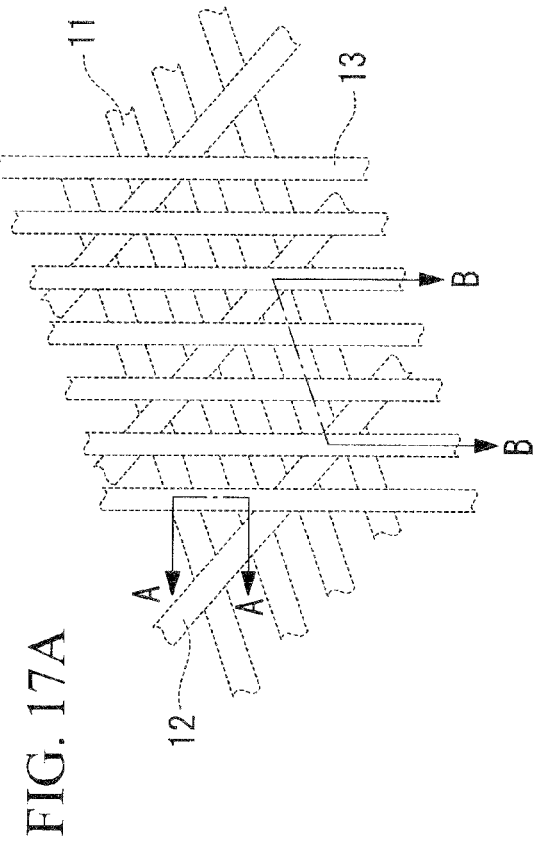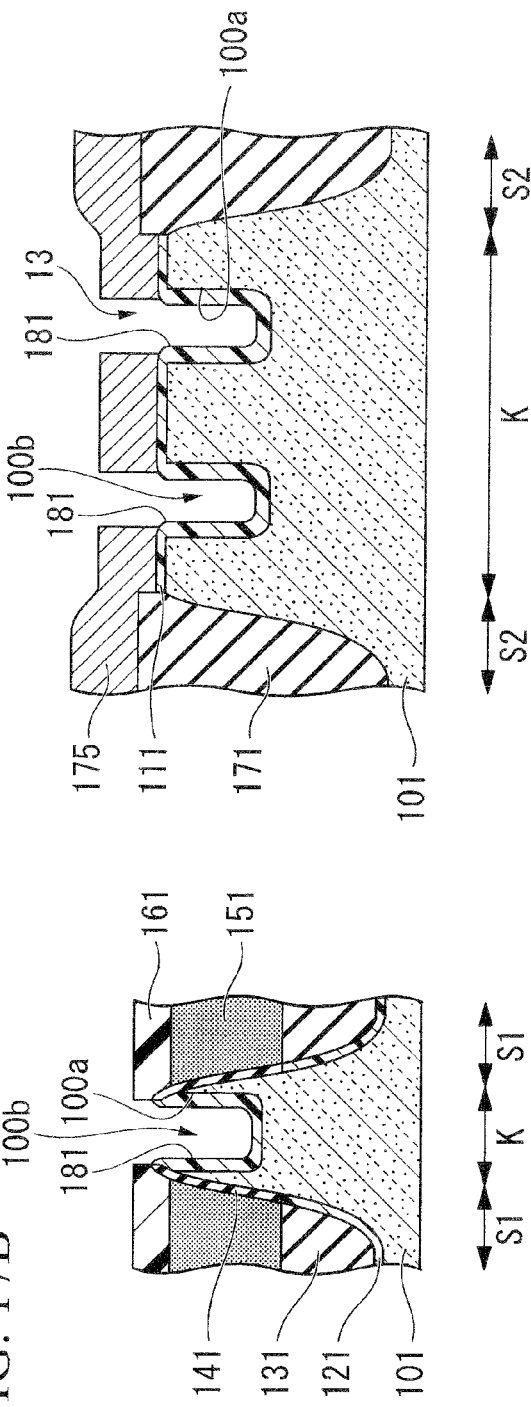

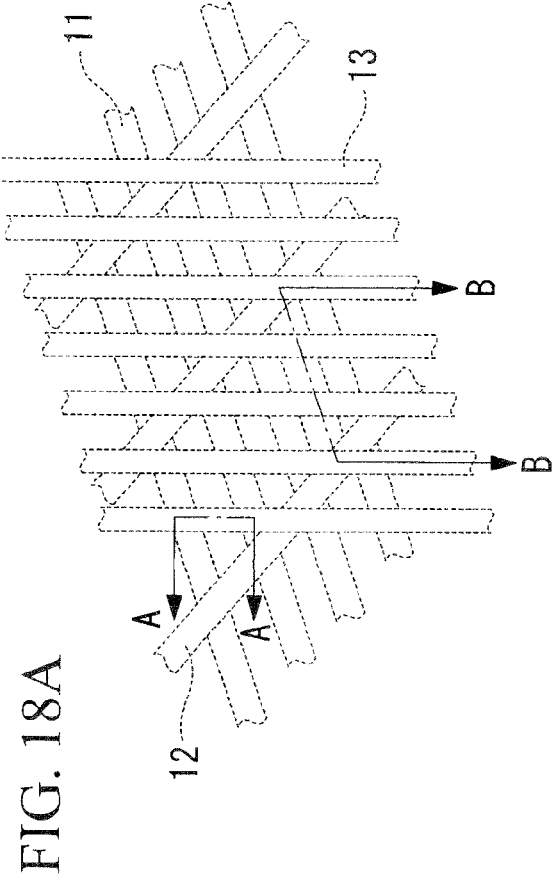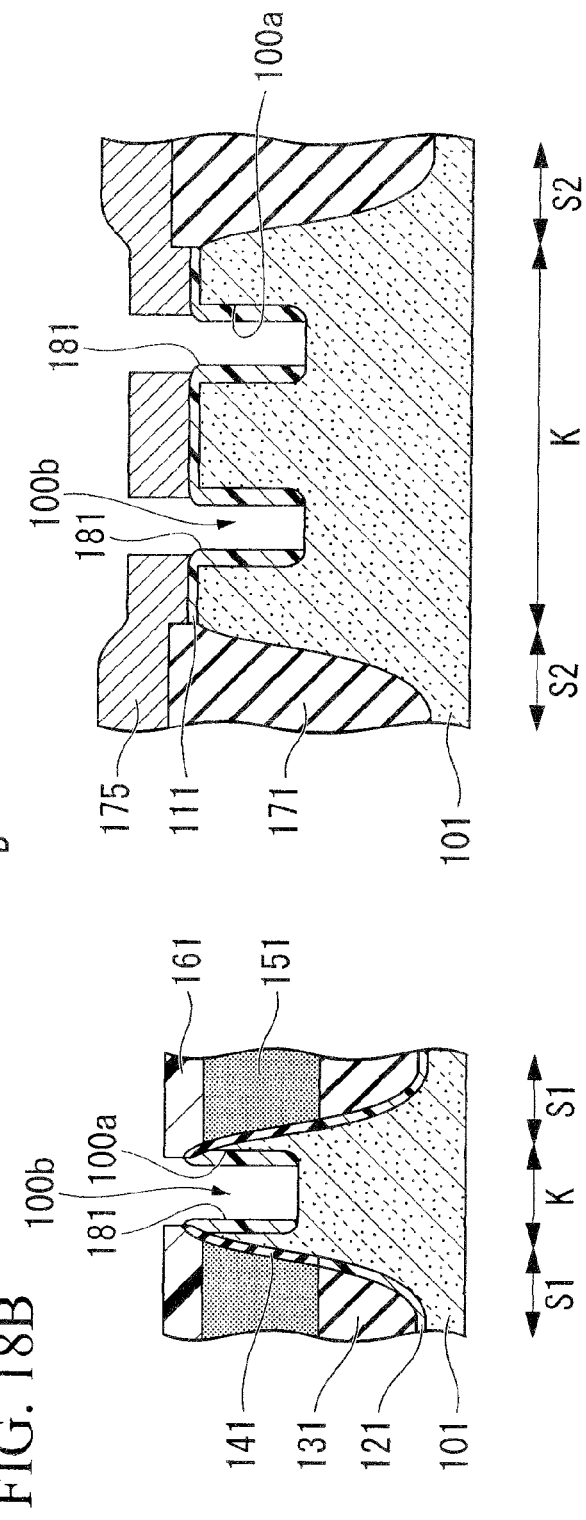

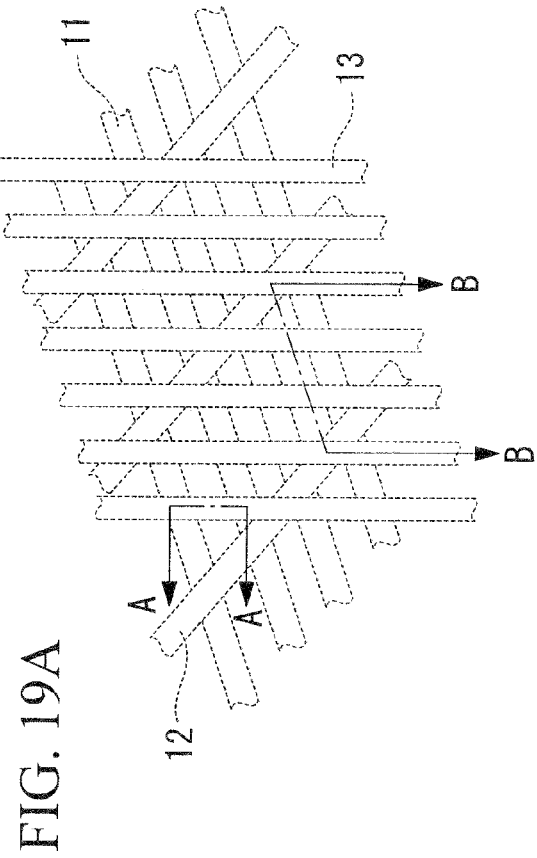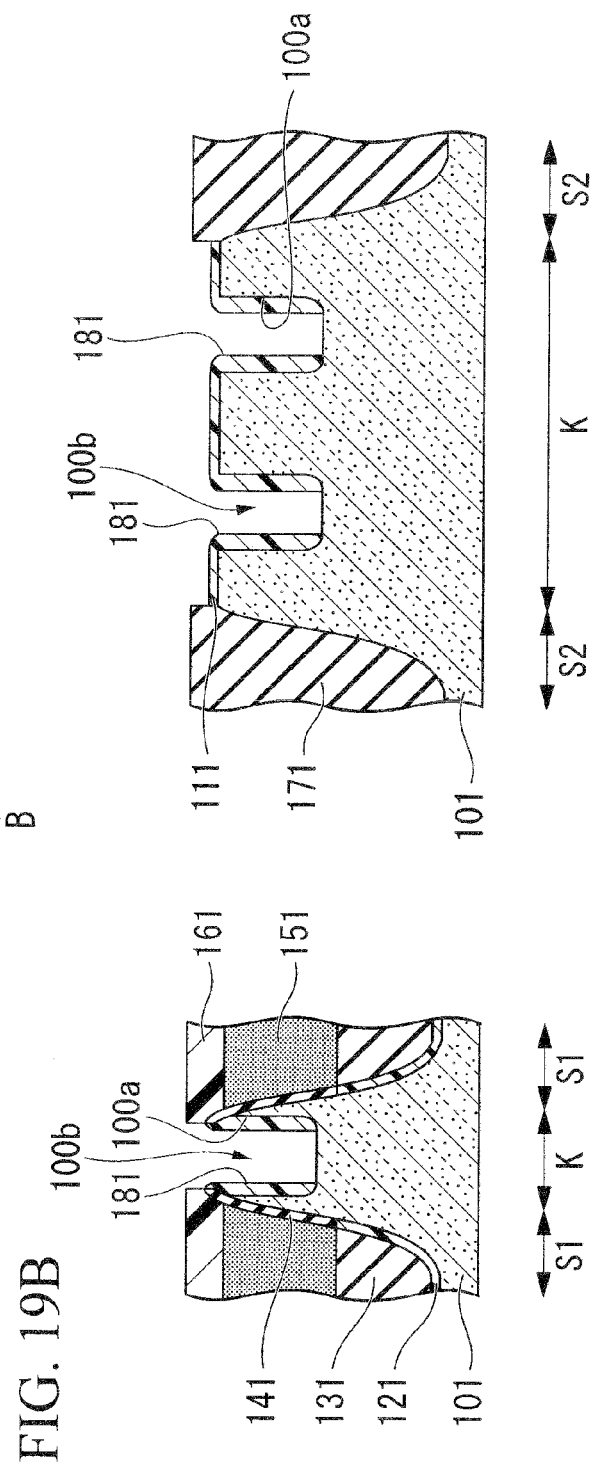
FIG. 19A
FIG. 19B
FIG. 19C

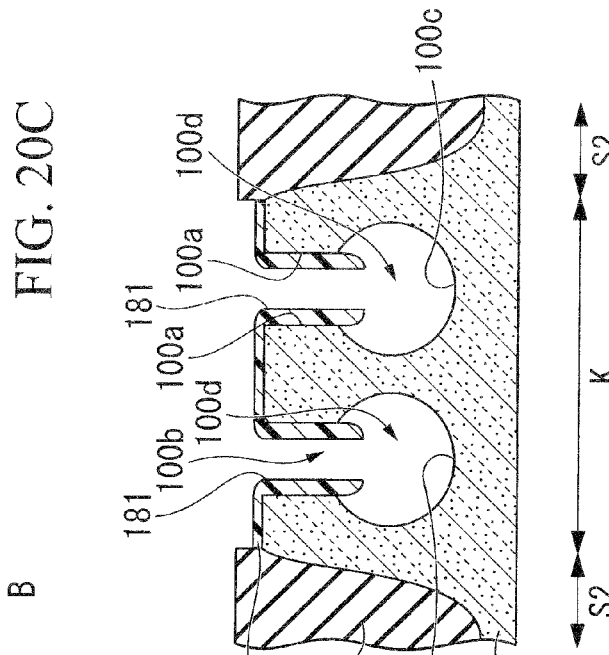
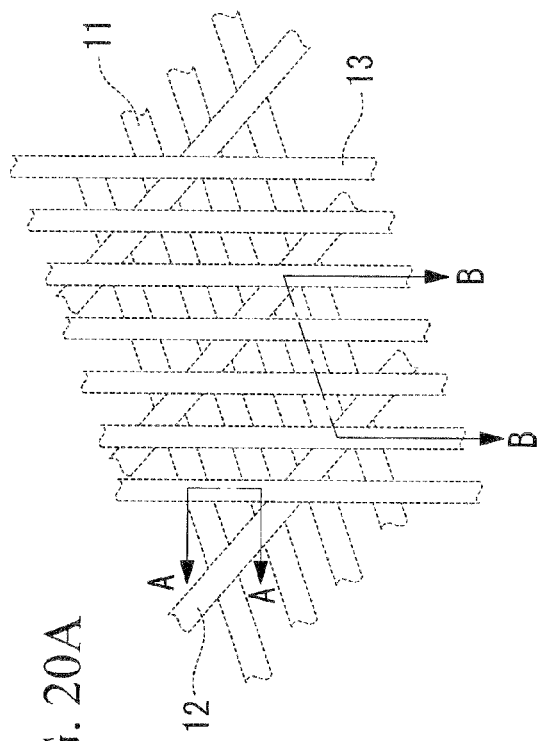
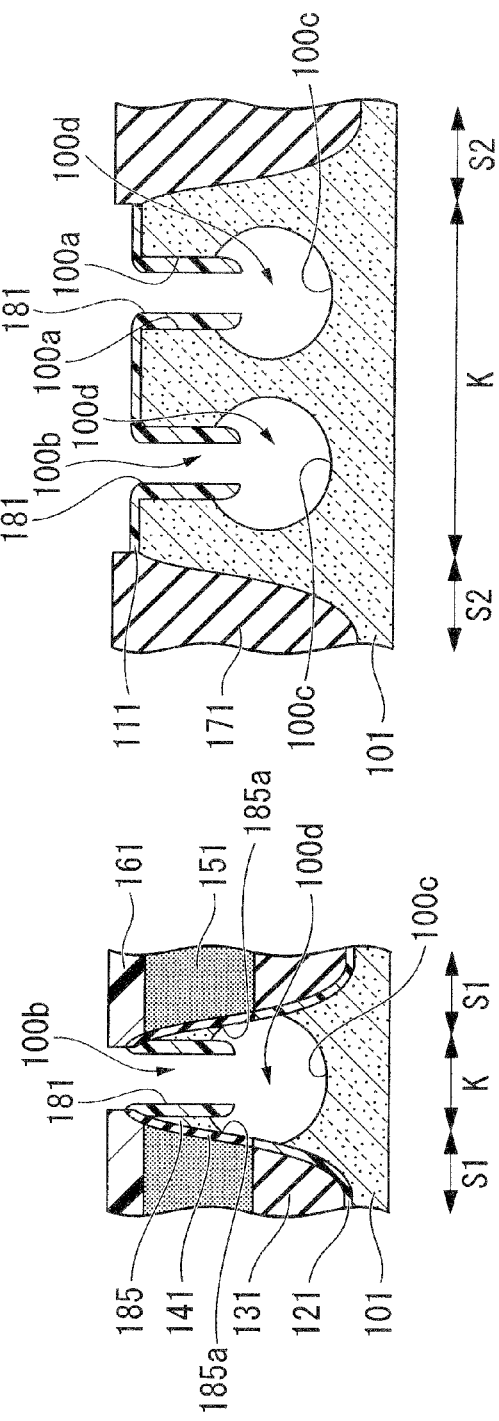

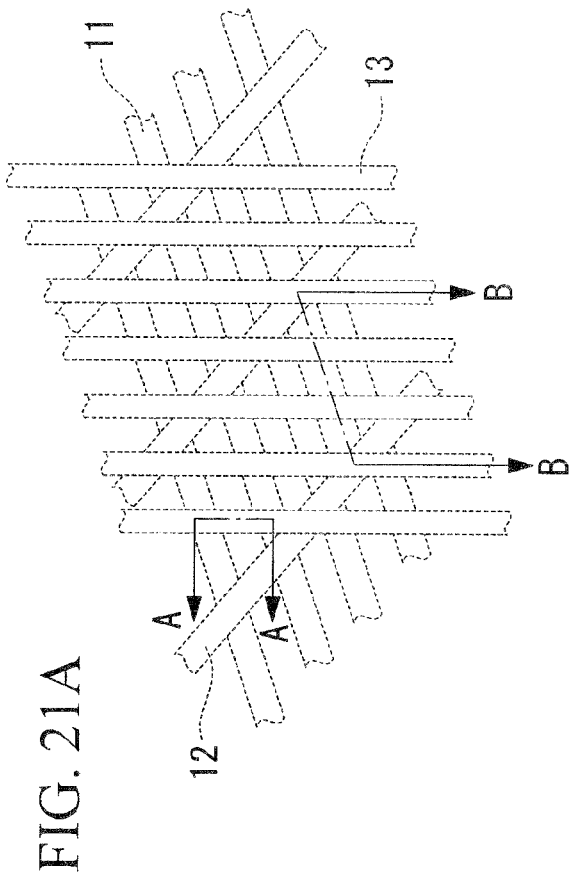
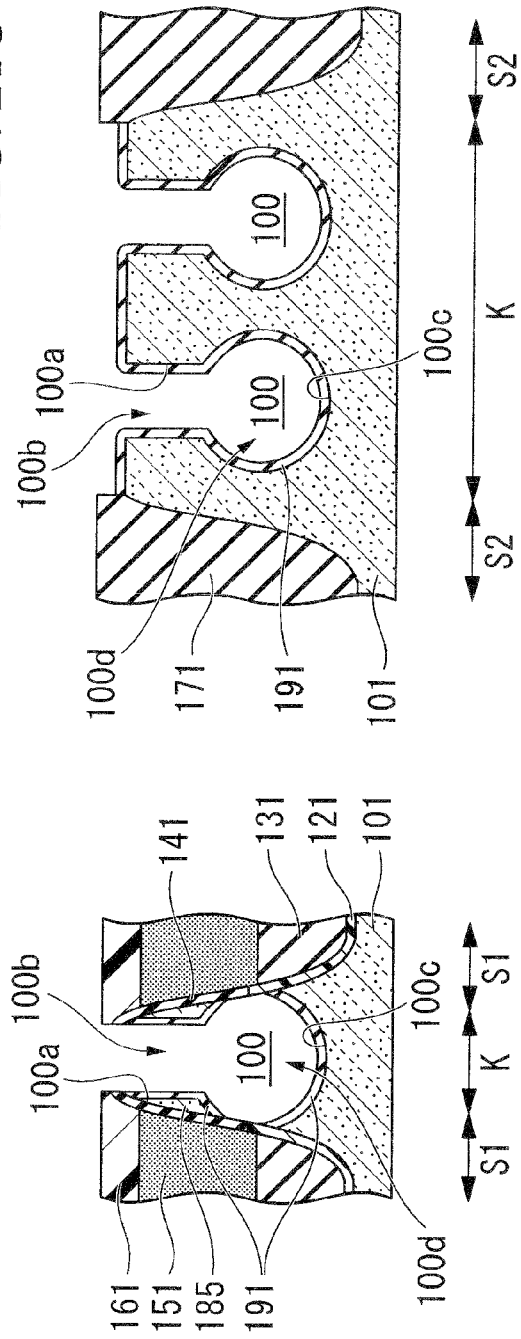
FIG. 21A
FIG. 21B
FIG. 21C

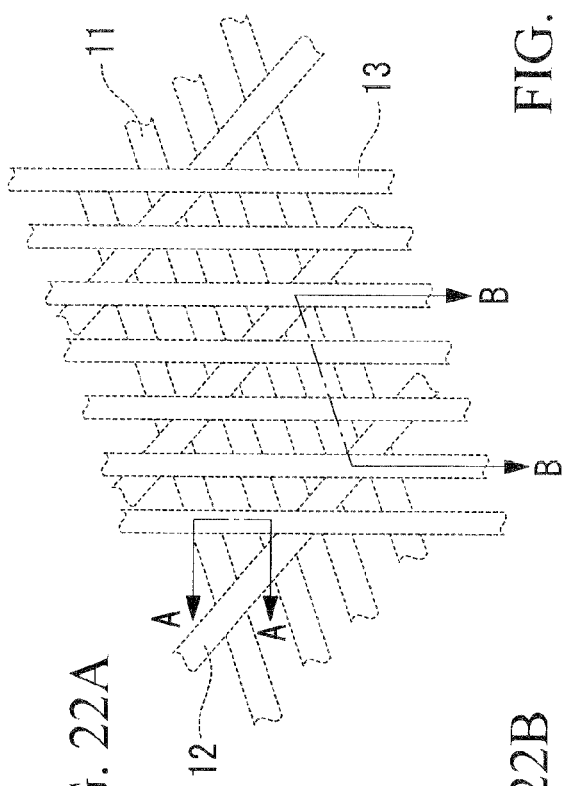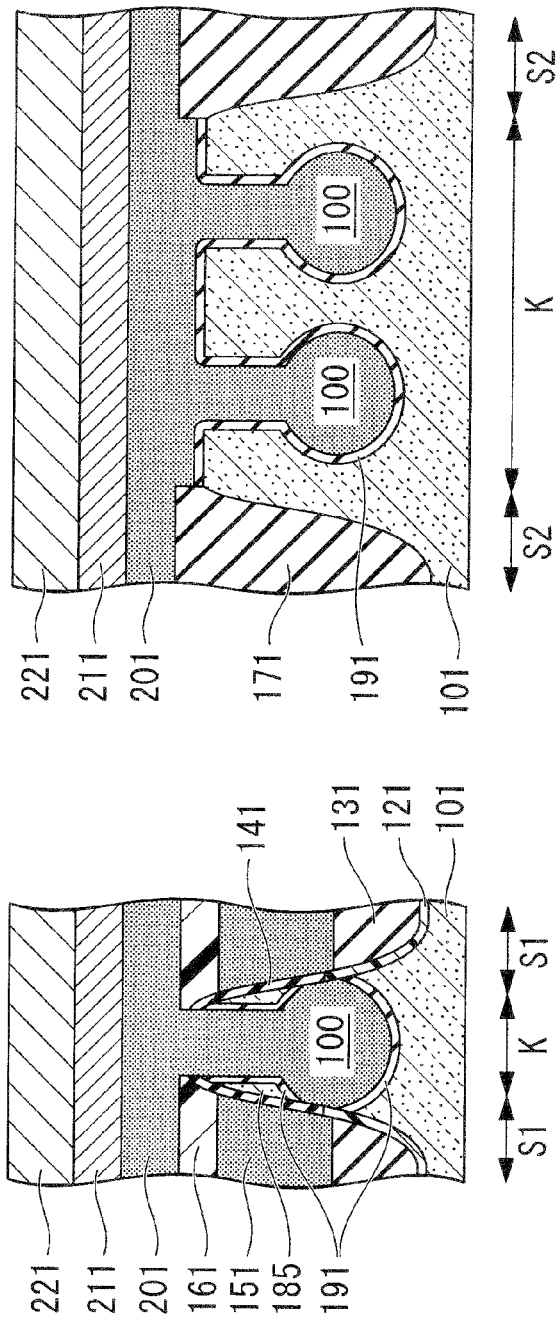

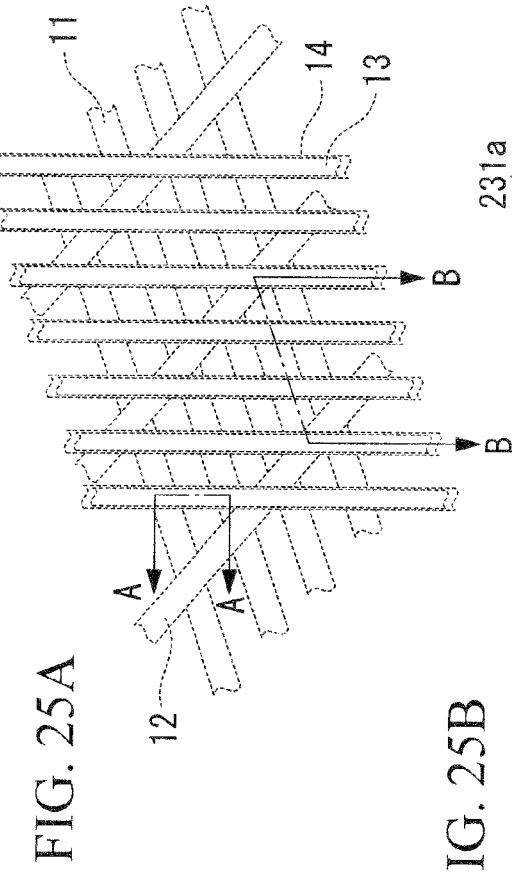
FIG. 25A
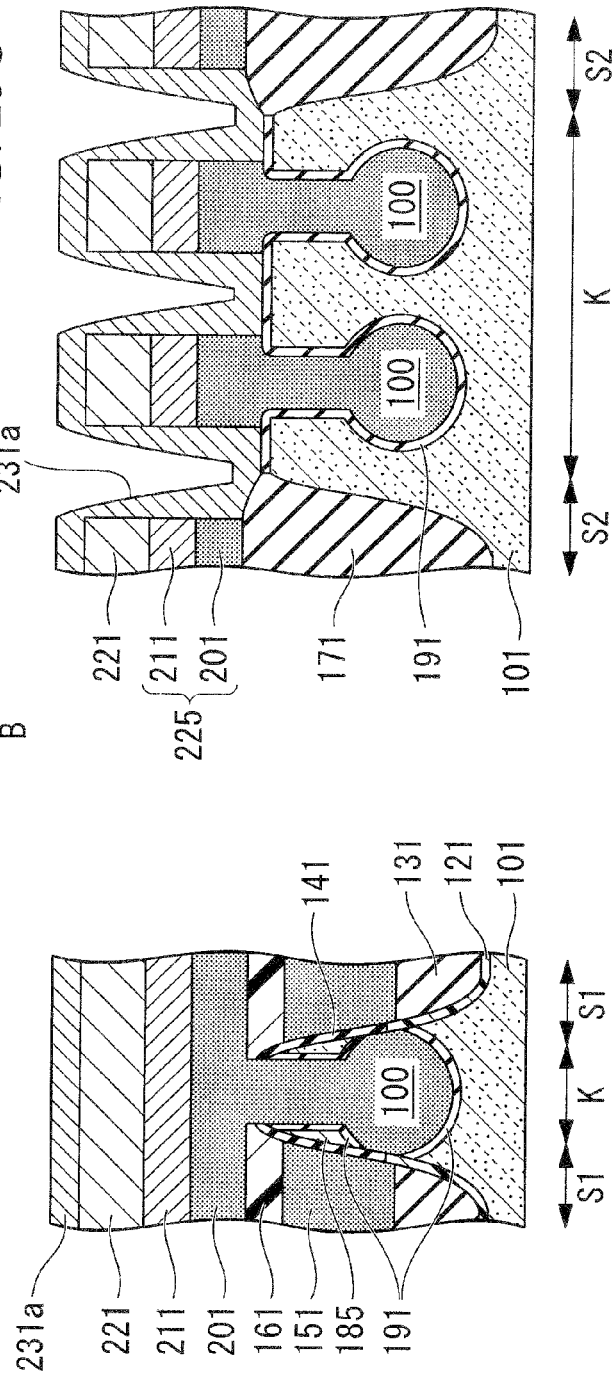
FIG. 25B
FIG. 25C

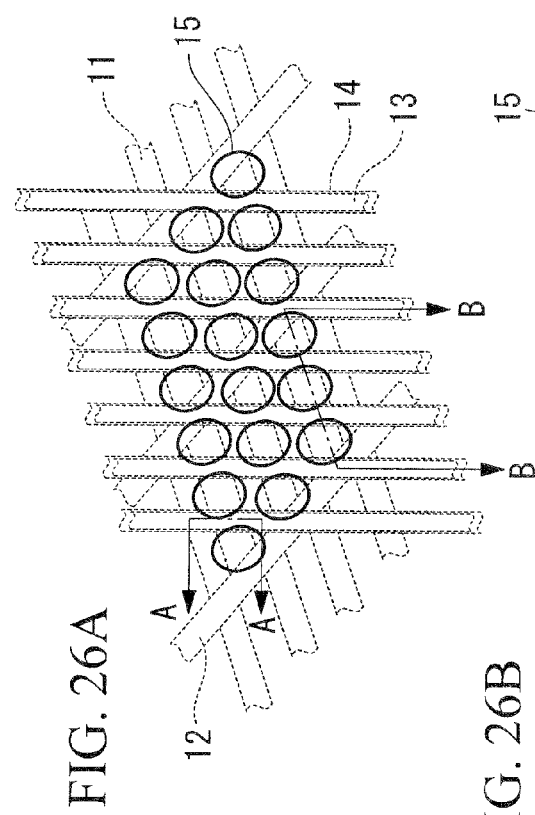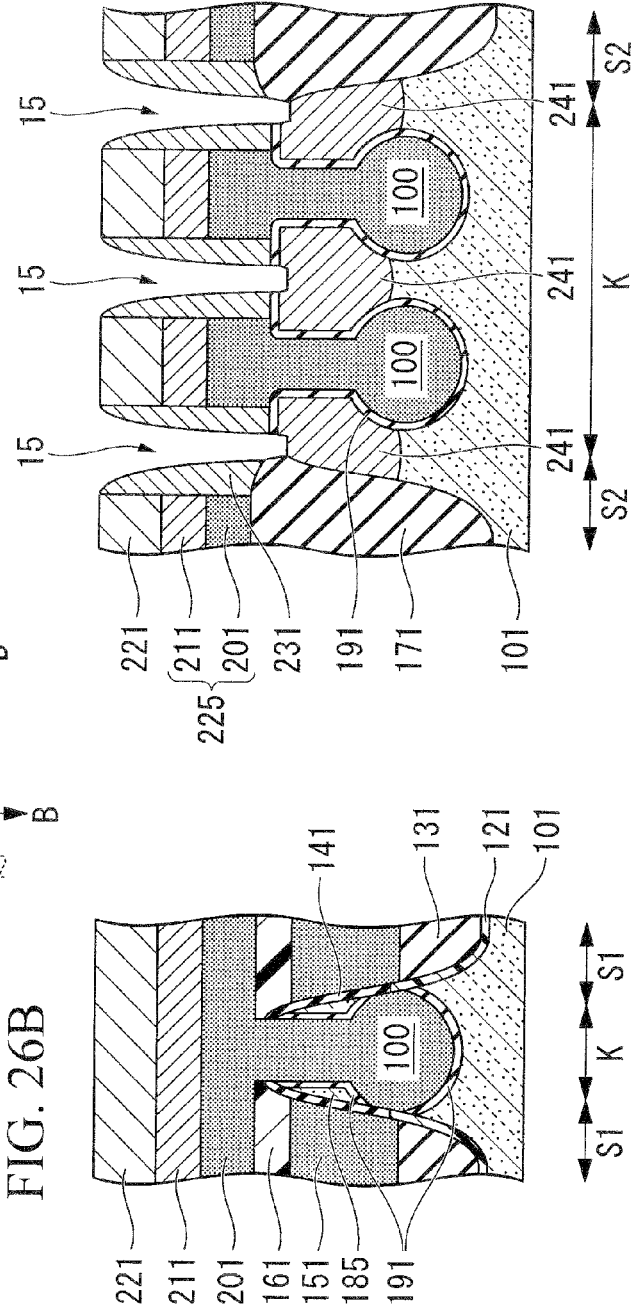

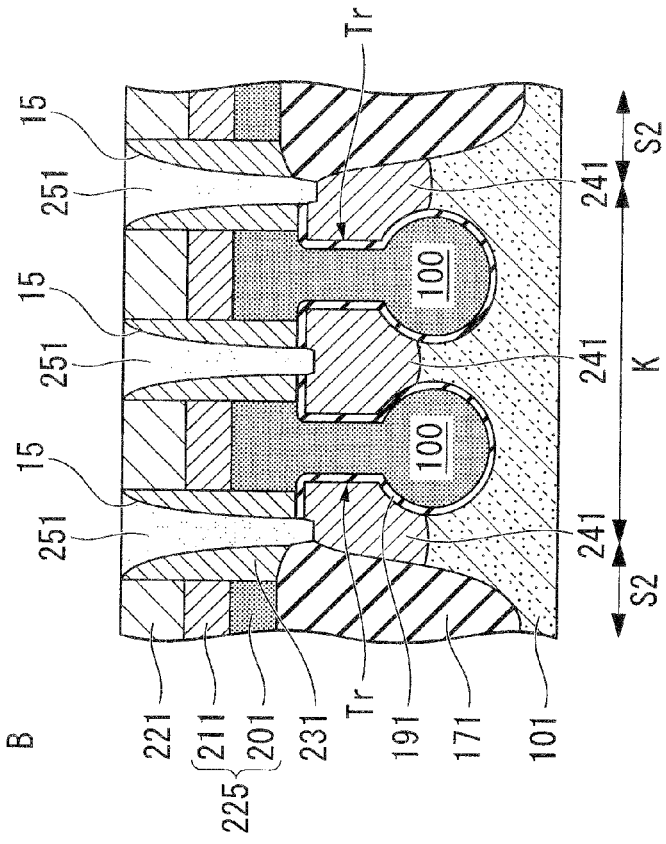
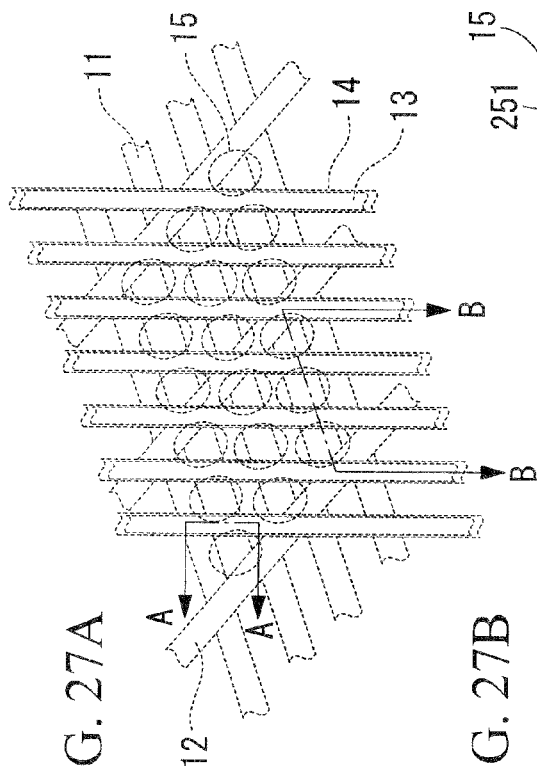
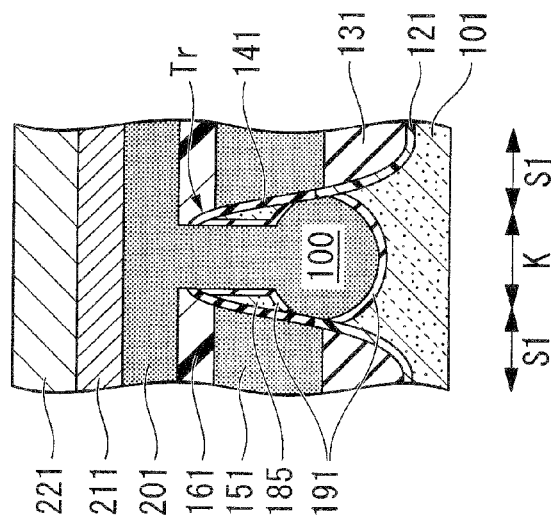
FIG. 27A
FIG. 27B
FIG. 27C

SEMICONDUCTOR DEVICE AND MANUFACTURING METHOD THEREFOR

BACKGROUND OF THE INVENTION

1. Field of the Invention

The present invention relates to semiconductor devices having trench-gate transistors. The present invention also relates to manufacturing methods of semiconductor devices. The present invention further relates to data processing systems including semiconductor devices.

The present application claims priority on Japanese Patent Application No. 2008-55104, the content of which is incorporated herein by reference.

2. Description of Related Art

Recently, semiconductor devices have been developed to have fine structures for transistors and to therefore suffer from deterioration of sub-threshold characteristics (referred to as "S-factor") such as reductions of threshold voltages due to short-channel effects. So-called fin-shaped field-effect transistors (referred to as "Fin-FET") using SOI (Silicon On Insulator) substrates have become popular among semiconductor manufacturers as high-performance transistors which do not cause S-factor deterioration. Various types of Fin-FET have been developed and disclosed in various documents such as Patent Document 1 and Patent Document 2.

Patent Document 1: Japanese Unexamined Patent Application Publication No. 2007-158269

Patent Document 2: Japanese Unexamined Patent Application Publication No. 2007-258660

Both of the above documents teach transistors having fin-shaped SOI structures which are formed inside trenches in active regions for use in channels.

SOI substrates are expensive in comparison with generally-used substrates composed of monocrystal silicon; hence, it is difficult to use SOI substrates for versatile products such as dynamic random-access memory (DRAM) produced at low cost.

The present inventor has recognized that the Fin-FET disclosed in Patent Documents 1 and 2 are depletion-type transistors having thin silicon layers serving as channel regions, which have difficulty in adjusting threshold voltages by controlling impurity densities of channel regions in transistors. For this reason, it is necessary to develop semiconductor devices including transistors such as Fin-FET having thin silicon layers serving as channel regions, which can be easily controlled in threshold voltages.

SUMMARY

The invention seeks to solve the above problem or to improve upon the problem at least in part.

In one embodiment, a semiconductor device including a trench-gate MOS transistor on a semiconductor substrate is constituted of an active region circumscribed by at least one separation region in the semiconductor substrate, a trench which is formed in the active region for use in the trench-gate MOS transistor, a fin channel region formed between the trench and the separation region in the active region, a first gate electrode which is embedded in the separation region in connection with the fin channel region via a first gate insulating film, a second gate electrode which is embedded in the trench in connection with the fin channel region via a second gate insulating film, and a source-drain diffusion region which is disposed beside the trench in the active region below the second gate electrode in connection with the fin channel region.

In another embodiment, a manufacturing method for the above semiconductor device is constituted of forming an active region circumscribed by at least one separation region, forming a trench for use in the trench-gate MOS transistor in the active region, forming a fin channel region between the trench and the separation region in the active region, forming a first gate electrode embedded in the separation region in connection with the fin channel region via a first gate insulating film, forming a second gate electrode embedded in the trench in connection with the fin channel region via a second gate insulating film, and forming a source-drain diffusion region which is disposed beside the trench in the active region below the second gate electrode in connection with the fin channel region.

In a further embodiment, a data processing system is formed using the above semiconductor device, which serves as a dynamic random-access memory or a phase-change nonvolatile memory, for example.

BRIEF DESCRIPTION OF THE DRAWINGS

The above features and advantages of the present invention will be more apparent from the following description of certain preferred embodiments taken in conjunction with the accompanying drawings, in which:

FIG. 1A is a plan view of a semiconductor device according to a first embodiment of the present invention;

FIG. 1B is a cross-sectional view taken along line A-A in FIG. 1A;

FIG. 1C is a cross-sectional view taken along line B-B in FIG. 1A;

FIG. 2A is a plan view used for explaining a first step of the manufacturing method of the semiconductor device;

FIG. 2B is a cross-sectional view taken along line A-A in FIG. 2A;

FIG. 2C is a cross-sectional view taken along line B-B in FIG. 2A;

FIG. 8A is a plan view used for explaining a seventh step of the manufacturing method of the semiconductor device;

FIG. 8B is a cross-sectional view taken along line A-A in FIG. 8A;

FIG. 8C is a cross-sectional view taken along line B-B in FIG. 8A;

FIG. 10A is a plan view used for explaining a ninth step of the manufacturing method of the semiconductor device;

FIG. 10B is a cross-sectional view taken along line A-A in FIG. 10A;

FIG. 10C is a cross-sectional view taken along line B-B in FIG. 10A;

FIG. 11A is a plan view used for explaining a tenth step of the manufacturing method of the semiconductor device;

FIG. 11B is a cross-sectional view taken along line A-A in FIG. 11A;

FIG. 11C is a cross-sectional view taken along line B-B in FIG. 11A;

FIG. 16A is a plan view used for explaining a fifteenth step of the manufacturing method of the semiconductor device;

FIG. 16B is a cross-sectional view taken along line A-A in FIG. 16A;

FIG. 16C is a cross-sectional view taken along line B-B in FIG. 16A;

FIG. 17A is a plan view used for explaining a sixteenth step of the manufacturing method of the semiconductor device;

FIG. 17B is a cross-sectional view taken along line A-A in FIG. 17A;

FIG. 17C is a cross-sectional view taken along line B-B in FIG. 17A;

FIG. 18A is a plan view used for explaining a seventeenth step of the manufacturing method of the semiconductor device;

FIG. 18B is a cross-sectional view taken along line A-A in FIG. 18A;

FIG. 18C is a cross-sectional view taken along line B-B in FIG. 18A;

FIG. 19A is a plan view used for explaining an eighteenth step of the manufacturing method of the semiconductor device;

FIG. 19B is a cross-sectional view taken along line A-A in FIG. 19A;

FIG. 19C is a cross-sectional view taken along line B-B in FIG. 19A;

FIG. 20A is a plan view used for explaining a nineteenth step of the manufacturing method of the semiconductor device;

FIG. 20B is a cross-sectional view taken along line A-A in FIG. 20A;

FIG. 20C is a cross-sectional view taken along line B-B in FIG. 20A;

FIG. 21A is a plan view used for explaining a twelfth step of the manufacturing method of the semiconductor device;

FIG. 21B is a cross-sectional view taken along line A-A in FIG. 21A;

FIG. 21C is a cross-sectional view taken along line B-B in FIG. 21A;

FIG. 22A is a plan view used for explaining a twenty-first step of the manufacturing method of the semiconductor device;

FIG. 22B is a cross-sectional view taken along line A-A in FIG. 22A;

FIG. 22C is a cross-sectional view taken along line B-B in FIG. 22A;

FIG. 25A is a plan view used for explaining a twenty-fourth step of the manufacturing method of the semiconductor device;

FIG. 25B is a cross-sectional view taken along line A-A in FIG. 25A;

FIG. 25C is a cross-sectional view taken along line B-B in FIG. 25A;

FIG. 26A is a plan view used for explaining a twenty-fifth step of the manufacturing method of the semiconductor device;

FIG. 26B is a cross-sectional view taken along line A-A in FIG. 26A;

FIG. 26C is a cross-sectional view taken along line B-B in FIG. 26A;

FIG. 27A is a plan view used for explaining a twenty-sixth step of the manufacturing method of the semiconductor device;

FIG. 27B is a cross-sectional view taken along line A-A in FIG. 27A;

FIG. 27C is a cross-sectional view taken along line B-B in FIG. 27A;

DETAILED DESCRIPTION OF PREFERRED EMBODIMENTS

Figure 3A:
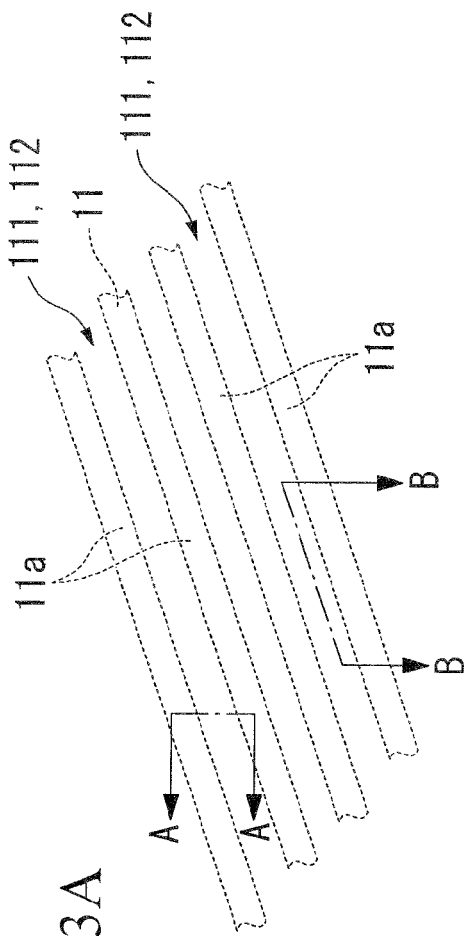
FIG. 3A is a plan view used for explaining a second step of the manufacturing method of the semiconductor device.

The present invention will be now described herein with reference to illustrative embodiments. Those skilled in the art will recognize that many alternative embodiments can be accomplished using the teachings of the present invention and that the invention is not limited to the embodiments illustrated for explanatory purposes.

A semiconductor device 1 according to a first embodiment of the present invention will be described with reference to FIGS. 1A to 1C. FIG. 1A is a plan view of the semiconductor device 1; FIG. 1B is a cross-sectional view taken along line A-A in FIG. 1A; and FIG. 1C is a cross-sectional view taken along line B-B in FIG. 1A. FIGS. 2A-2C to FIGS. 27A-27C are used to explain a manufacturing method of the semiconductor device 1. These drawings are drawn for explanatory purpose in explaining the semiconductor device 1 and its manufacturing method; hence, sizes, thicknesses, and dimensions of illustrated parts do not precisely match those of actual products.

1. Semiconductor Device

The semiconductor device 1 includes a trench-gate MOS transistor Tr formed on a semiconductor substrate 101. FIGS. 1A to 1C show the layout in which the semiconductor device 1 is adapted to a memory cell of a DRAM having an n-type MOS FET structure.

FIG. 1A shows that separation regions S having STI (Shallow Trench Insulation) structures and active regions K (encompassed by separation regions S) are formed in the semiconductor substrate 101. FIG. 1A shows that each of the active regions K is defined in a rectangular shape in plan view, wherein the active regions K are regularly aligned in longitudinal directions thereof. The separation regions S surrounding the active regions K are constituted of first separation regions S1 and second separation regions S2. The first separation regions S1 are disposed on the opposite sides of the active regions K in their widths directions and are elongated along the longitudinal sides of the active regions K. FIG. 1A shows that first gate electrodes 3 serving as back-gates are disposed in the first separation regions S1. The second separation regions S2 are disposed on the opposite sides of the active regions K in their longitudinal directions and are sandwiched between the first separation regions S1.

Each of the active regions K is disposed to cross two word lines 2. A trench 100 is formed at a part of the active region K crossing the word line 2 and is embedded in the word line 2. The word lines 2 form second gate electrodes 225 serving as trench gates.

FIG. 1B is a cross-sectional view of FIG. 1A taken along the line A-A which lies in parallel with the word line 2 in the width direction of the active region K. FIG. 1C is a cross-sectional view of FIG. 1A taken along the line B-B which crosses the word line 2 and lies in the longitudinal direction of the active region K.

In the cross section of FIG. 1B taken along line A-A in FIG. 1A, the semiconductor substrate 101 has the active region K sandwiched between the first separation regions S1. The first separation region S1 has a STI structure in which a first separation insulating film 131 is embedded in a first separation trench 11a formed in the semiconductor substrate 101. The active region K is a projection T composed of a semiconductor material which is formed above the semiconductor substrate 101 due to the formation of the first separation trenches 11a.

In the first separation region 11a, a first gate electrode 151 (designated by reference numeral 3 in FIG. 1A) and a silicon oxide film 161 (used for insulating the first gate electrode 151) are sequentially deposited on the first separation insulating film 131 in the first separation trench 11a. A silicon oxide film 121 serving as an insulating film covering the interior surface of the first separation trench 11a is deposited between the first separation insulating film 131 and the semiconductor substrate 101. A first gate insulating film 141 is deposited on a side surface T1 of the projection T opposite to the first gate electrode 151. A fin channel region 185 is formed as a part of the active region K positioned opposite to the first gate electrode 151. That is, the first gate electrode 151 is positioned opposite to the fin channel region 185 via the first gate insulating film 141.

The trench 100 formed in the active region K is constituted of a first trench 100b having a vertical interior surface 100a, which is elongated in a direction substantially perpendicular to the semiconductor substrate 101, and a second trench 100d having a circular interior surface 100c, which communicates with the first trench 100b. A second gate insulating film 191 is formed on the interior surfaces 100a and 100c of the trench 100.

A pair of fin channel regions 185 which are positioned opposite to each other via the trench 100 is formed in the active region K at prescribed positions between the trench 100 and the first separation regions S1. Each of the fin channel regions 185 is circumscribed by the first trench 100b and the second trench 100d, wherein a lowermost end 185a thereof is isolated from the semiconductor substrate 100b1 via the second trench 100d. The fin channel regions 185 are connected to source-drain diffusion regions 241 (see FIG. 1C) and are each disposed between the first trench 100b and the first gate electrode 151. The fin channel regions 185 are disposed in contact with the first gate electrodes 151 via the first gate insulating films 141. The first gate electrodes 151 are extended in parallel in the longitudinal directions of the fin channel regions 185. Bottom portions 151a of the first gate electrodes 151 are disposed at deep positions which are lower than the lowermost ends 185a of the fin channel regions 185.

A polysilicon layer 201 is partially embedded inside the trench 100. A low-resistance film 211 and a cap insulating film 221 are sequentially deposited on the polysilicon layer 201. A second gate electrode 225 is constituted of the polysilicon layer 201 and the low-resistance film 211. The fin channel region 185 is disposed in contact with the second gate electrode 225 via a second gate insulating film 191.

A silicon oxide film 161 is formed on the first gate electrode 151 so as to insulate the first gate electrode 151 from the second gate electrode 225.

FIG. 1C shows a cross section of the semiconductor device 1 taken along line B-B in FIG. 1A in which second separation insulating films 171 composed of silicon oxide are formed on the opposite sides of the active region K in its longitudinal direction. The second separation region S2 is a single-layered film composed of the second separation insulating film 171. Two trenches 100 are formed in the active region K in the cross section taken along line B-B. Impurity diffusion layers 241 serving as source-drain diffusion regions are formed in the active region K. Each trench 100 is disposed in contact with the source-drain diffusion region 241 via the second gate insulating film 191. The source-drain diffusion regions 241 connected with the fin channel regions 185 are disposed on the opposite sides of the trench 100 via the second gate electrode 225. Side walls 231 are formed on the side surfaces of the second gate electrode 225 and the cap insulating film 221 so as to insulate contact plugs 251 from the second gate electrode 225.

The semiconductor device 1 of the first embodiment is designed to fabricate the trench-gate MOS transistor Tr, which is constituted of the trench 100 formed in the active region K, the fin channel regions 185, the first gate electrodes 151 disposed in contact with the fin channel regions 185 via the first gate insulating films 141, the second gate electrode 225 disposed in contact with the fin channel regions 185 via the second gate insulating films 191, and the impurity diffusion regions 241 serving as source-drain diffusion regions. In the trench-gate MOS transistor Tr, the first gate electrode 151 installed in the first separation region S1 serves as a back-gate, while the second gate electrode 225 partially embedded in the trench 100 serves as a trench gate. Thus, the trench-gate MOS transistor Tr is driven by the first gate electrode 151 and the second gate electrode 225. In the transistor Tr, the fin channel regions 185 are formed in the active region K opposite to the first separation region S1, and the second trench 100d is etched approximately in a spherical shape so as to electrically isolate the fin channel regions 185 from the semiconductor substrate 101. The threshold voltage of the transistor Tr is adjusted by the back-gate (i.e. the first gate electrode 151 elongated in parallel in the longitudinal direction of the fin channel region 185).

2. Manufacturing Method of Semiconductor Device

Next, the manufacturing method of the semiconductor device 1 will be described with reference to FIGS. 2A-2C to FIGS. 27A-27C, wherein the suffix "A" following each figure number indicates a plan view, the suffix "B" following each figure number indicates a cross section taken along line A-A in the illustration "A", and the suffix "C" following each figure number indicates a cross section taken along line B-B in the illustration "A".

The manufacturing method is subdivided into five processes, namely, a first separation region forming process, a second separation region forming process, a trench forming process, a second gate forming process, and a source-drain forming process, which will be sequentially described below.

(A) First Separation Region Forming Process

In the first separation region forming process, the first gate insulating films 141 and the first gate electrodes 151 are formed on the opposite sides of the active region K in its width direction, thus forming the first separation regions S1 on the semiconductor substrate 101.

Specifically, as shown in FIGS. 2A to 2C, a silicon oxide film 111 of a 10 nm thickness is formed on a surface 101a of the semiconductor substrate 101 composed of p-type silicon by way of generally-known thermal oxidation. Subsequently, a silicon nitride film 112 of a 150 nm thickness is deposited on the silicon oxide film 11 by way of LP-CVD (Low-Density Plasma Chemical Vapor Deposition). Then, the silicon oxide film 111 and the silicon nitride film 112 are subjected to patterning by way of well-known lithography and dry etching, thus forming a plurality of slit patterns 11 in connection with the active region K. The surface 101a of the semiconductor substrate 101 is partially exposed in the slit patterns 11.

Figure 3C:
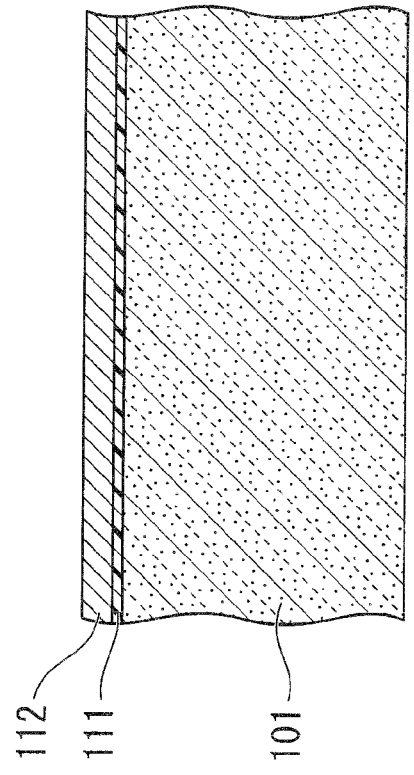
FIG. 3C is a cross-sectional view taken along line B-B in FIG. 3A.
Figure 3B:
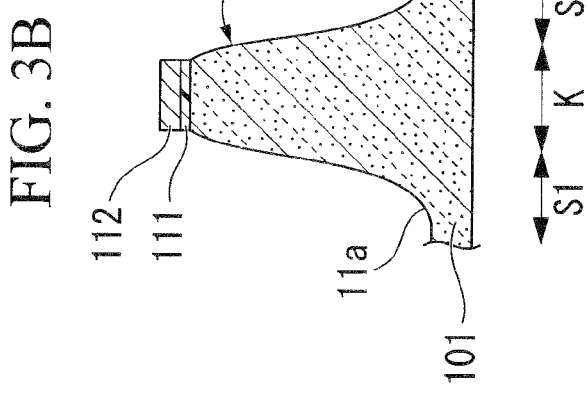
FIG. 3B is a cross-sectional view taken along line A-A in FIG. 3A.

Next, as shown in FIGS. 3A to 3C, the slit patterns 11 of the silicon substrate 101 are etched using the silicon nitride film 112 as a mask at a depth of 200 nm, for example, thus forming the first separation trenches 11a. FIG. 3A shows a plan view of the first separation trenches 11a by use of dotted lines. The first separation trenches 11a form the first separation regions s1. Due to the formation of the first separation trenches 11a, a projection T serving as the active region K is formed in the semiconductor substrate 101. In order to facilitate easy understanding of the manufacturing method, the slit patterns 11 are designated by dotted lines.

Figure 4A:
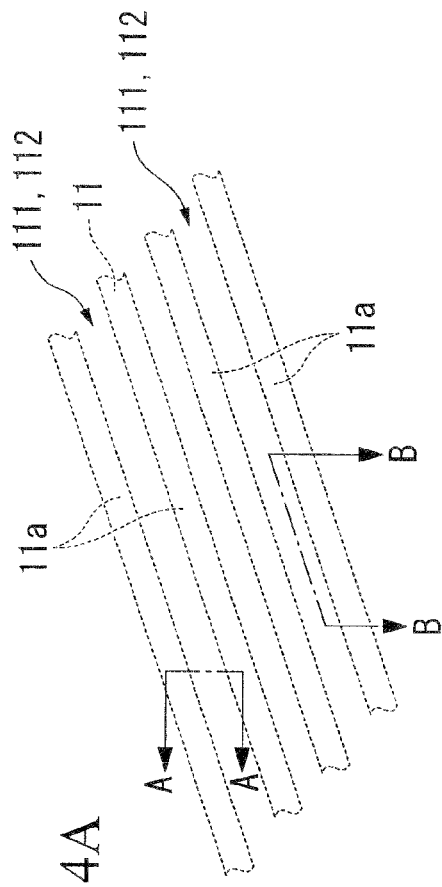
FIG. 4A is a plan view used for explaining a third step of the manufacturing method of the semiconductor device.
Figure 4B:
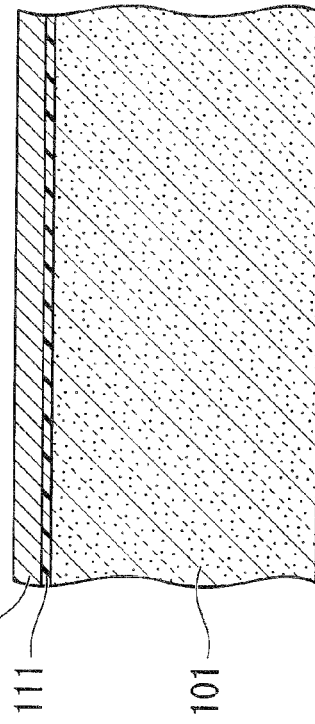
FIG. 4B is a cross-sectional view taken along line A-A in FIG. 4A.
Figure 4C:
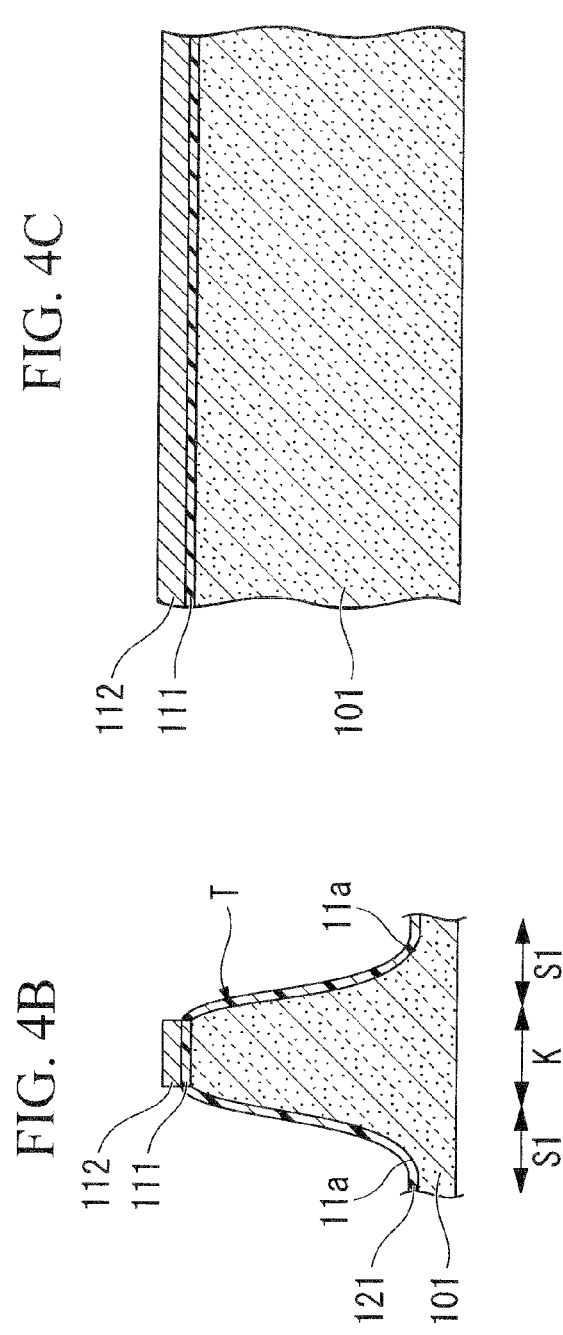
FIG. 4C is a cross-sectional view taken along line B-B in FIG. 4A.

Next, as shown in FIGS. 4A to 4C, thermal oxidation is performed to form a silicon oxide film 121 on the interior surface of the first separation trenches 11a.

Figure 5A:
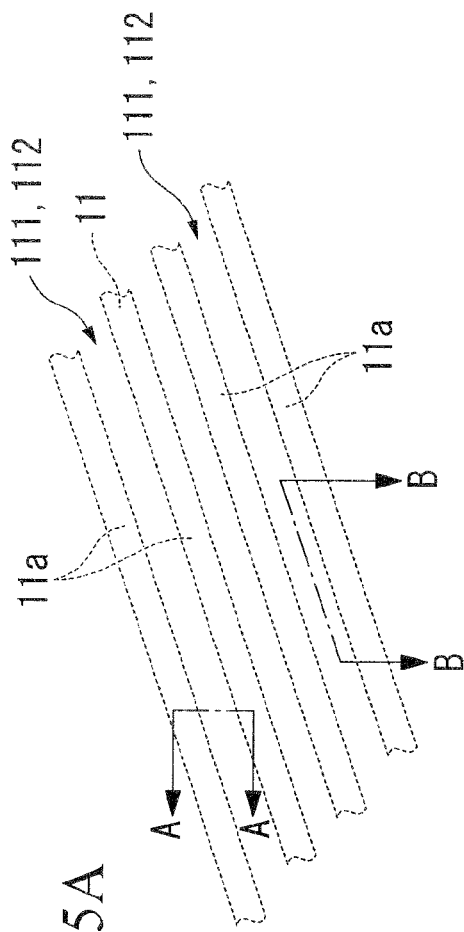
FIG. 5A is a plan view used for explaining a fourth step of the manufacturing method of the semiconductor device.
Figure 5C:
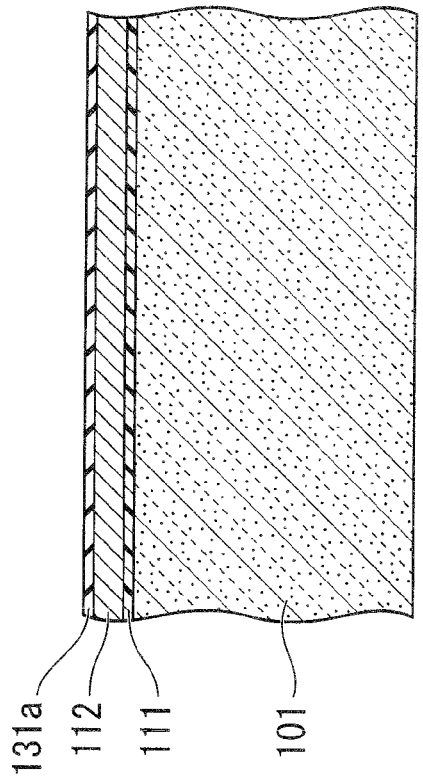
FIG. 5C is a cross-sectional view taken along line B-B in FIG. 5A.
Figure 5B:
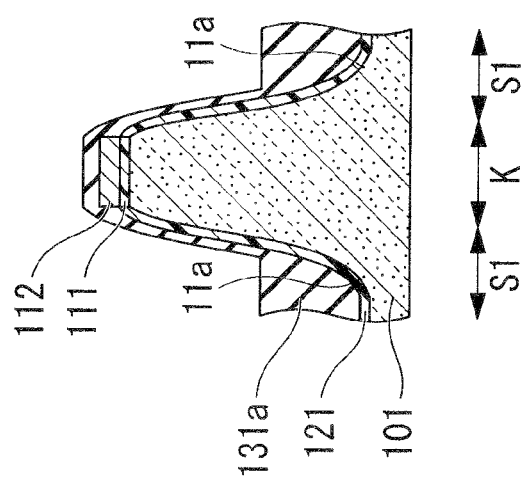
FIG. 5B is a cross-sectional view taken along line A-A in FIG. 5A.

Next, as shown in FIGS. 5A to 5C, an insulating film 131a is applied onto the silicon nitride film 112 by way of spinning application. Due to the technical feature of spinning application, the insulating film 131a is increased in thickness on the bottom portion of the first separation trench 11a while is decreased in thickness on the other areas of the first separation trench 11a. That is, the thickness of the insulating film 131a is increased to 70 nm on the bottom portion of the first separation trench 11a, for example. Subsequently, the insulating film 131a is reformed by way of a thermal treatment in an oxygen atmospheric condition.

Figure 6A:
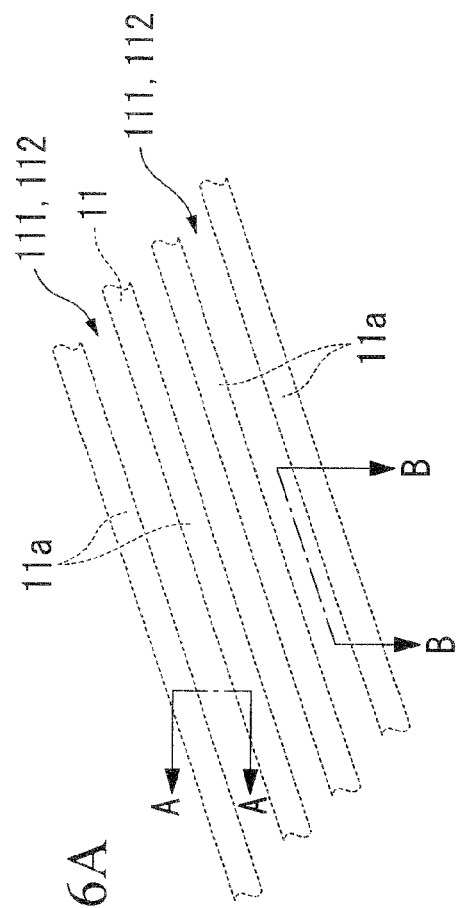
FIG. 6A is a plan view used for explaining a fifth step of the manufacturing method of the semiconductor device.
Figure 6C:
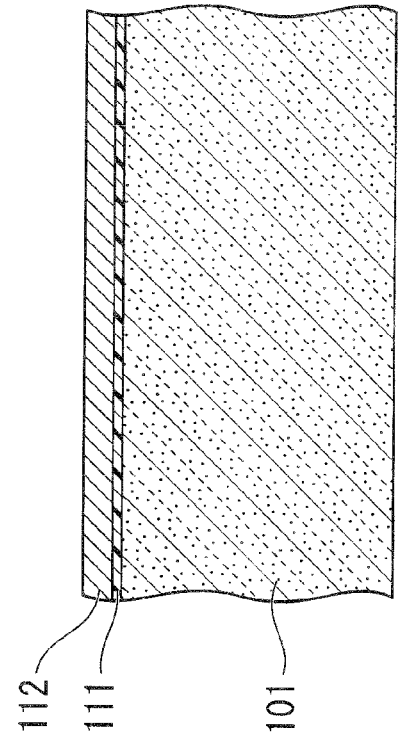
FIG. 6C is a cross-sectional view taken along line B-B in FIG. 6A.
Figure 6B:
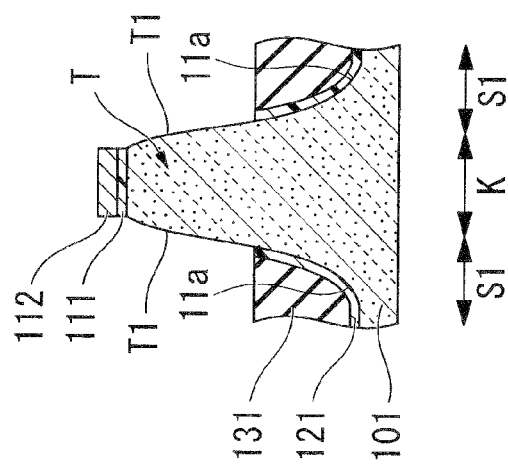
FIG. 6B is a cross-sectional view taken along line A-A in FIG. 6A.

Next, as shown in FIGS. 6A to 6C, the insulating film 131a and the silicon oxide film 121 are subjected to wet etching to a thickness of about 20 nm by use of a hydrofluoric (HF) solution. The etching value is determined to an extent that the insulating film 131a and the silicon oxide film 121 are completely removed from the side surfaces T1 of the projection T. In this step, the first separation insulating film 131 is embedded in the bottom portion of the first separation trench 11a serving as the first separation region S1.

Figure 7A:
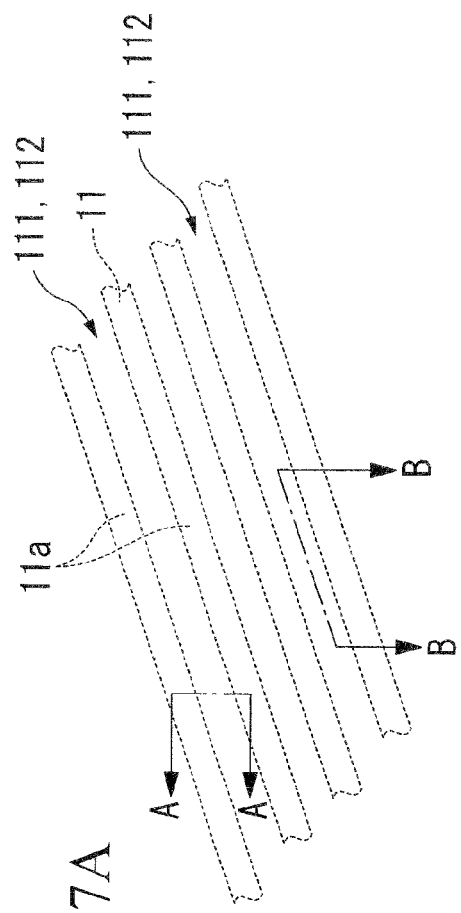
FIG. 7A is a plan view used for explaining a sixth step of the manufacturing method of the semiconductor device.
Figure 7C:
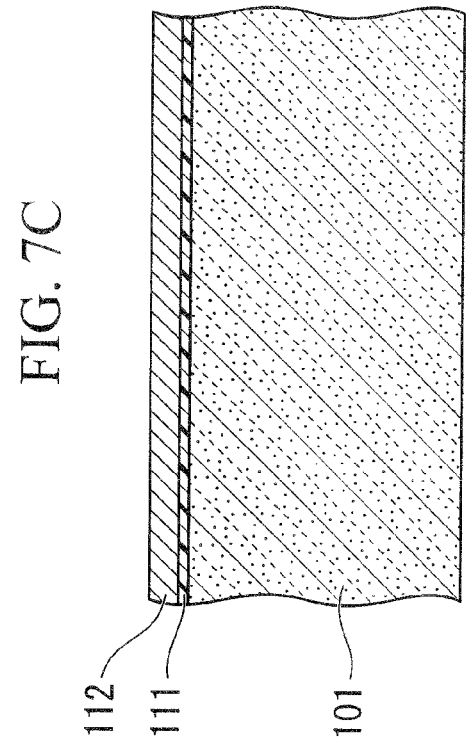
FIG. 7C is a cross-sectional view taken along line B-B in FIG. 7A.
Figure 7B:
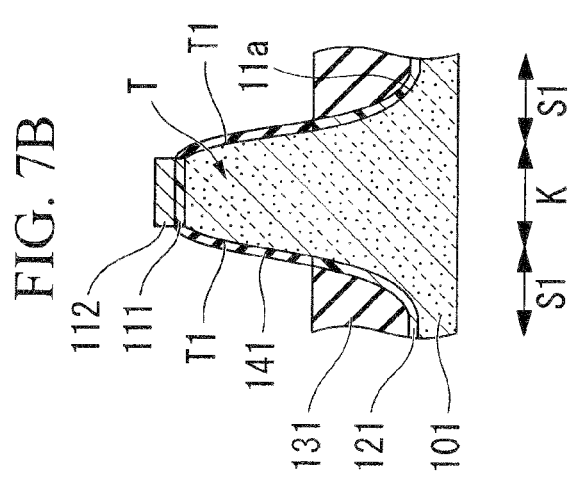
FIG. 7B is a cross-sectional view taken along line A-A in FIG. 7A.

Next, as shown in FIGS. 7A to 7C, thermal oxidation is performed to form a silicon oxide film of a 6 nm thickness on the side surface T1 of the projection T above the first separation insulating film 131, thus forming the first gate insulating film 141.

Next, as shown in FIGS. 8A to 8C, a polysilicon layer 151b in which phosphorus is doped at a density of $1 \times 10^{20}/cm^3$ is formed on the entire surface of the semiconductor substrate 101 by way of LP-CVD. In the cross section of FIG. 8C taken along line B-B in FIG. 8A, the polysilicon layer 151b is deposited with a 40 nm thickness, for example. Thus, the projection T and the first separation trenches 11a are completely embedded inside the polysilicon layer 151b.

Figure 9A:
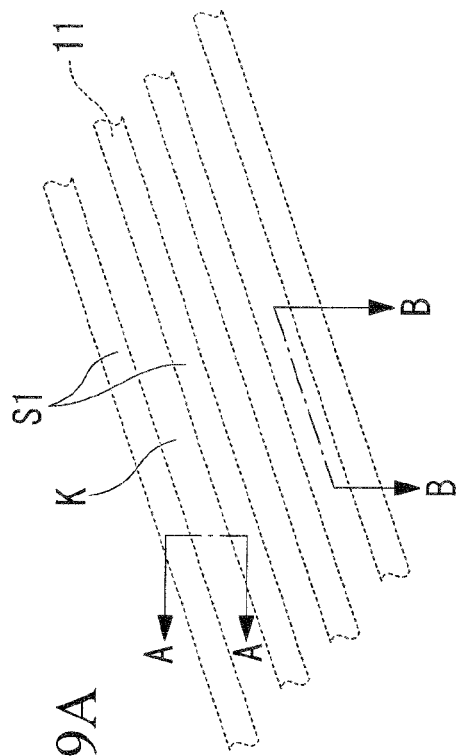
FIG. 9A is a plan view used for explaining an eighth step of the manufacturing method of the semiconductor device.
Figure 9B:
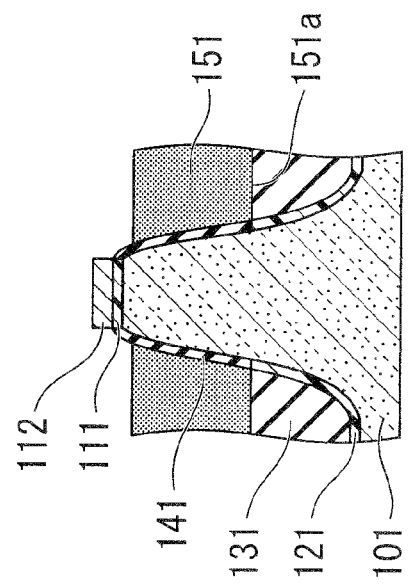
FIG. 9B is a cross-sectional view taken along line A-A in FIG. 9A.
Figure 9C:
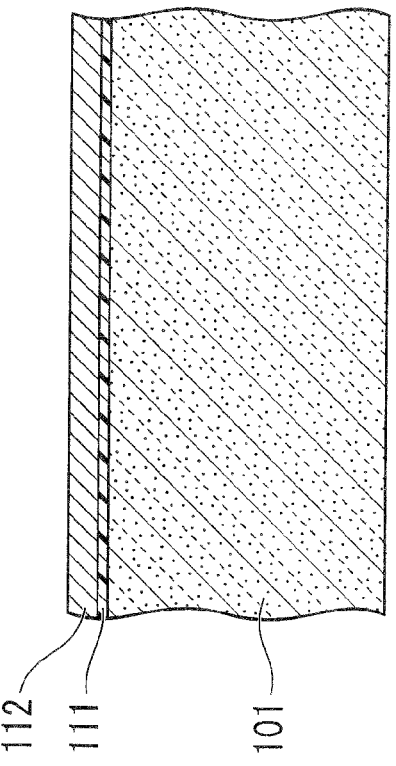
FIG. 9C is a cross-sectional view taken along line B-B in FIG. 9A.

Next, as shown in FIGS. 9A to 9C, the polysilicon layer 151b is polished and removed using the silicon nitride film 112 as a stopper by way of CMP (Chemical-Mechanical Polishing). Subsequently, anisotropic dry etching is performed using a mixed gas composed of HBr and $O_2$ so that the polysilicon layer 151b is further etched with a depth of 50 nm below the surface of the silicon nitride film 112. In this step, the first gate electrode 151 serving as a back-gate electrode is formed and deposited on the first separation insulating film 131. The first gate insulating film 141 is covered with the first gate electrode 151.

The first gate electrode 151 is adjusted in such a way that the bottom portion 151a thereof is disposed at a deep position lower than the lowermost portion 185a of the fin channel region 185. This adjustment can be achieved by adjusting the thickness of the first separation insulating film 131. Alternatively, it can be achieved by adjusting the trench 100 in the trench forming process.

Next, as shown in FIGS. 10A to 10C, a silicon oxide film 161 is formed on the entire surface of the semiconductor device 101 with a 100 nm thickness by way of LP-CVD.

Next, as shown in FIGS. 11A to 11C, the silicon oxide film 161 is polished and removed using the silicon nitride film 112 as a stopper by way of CMP, thus embedding the silicon oxide film 161 only on the first gate electrode 151. During the formation of the second separation region S2 by way of etching of the semiconductor substrate 101, the silicon oxide film 161 serves as a mask for etching the first gate electrode 151. The silicon oxide film 161 also serves as an insulating film covering the first gate electrode 151 and the second gate electrode 225.

(B) Second Separation Region Forming Process

In the second separation region forming process, the second separation regions S2 are formed on the opposite sides of the active region K in its longitudinal direction in the semiconductor substrate 101, wherein the active region K is surrounded by the first separation region S1 and the second separation region S2.

Figure 12A:
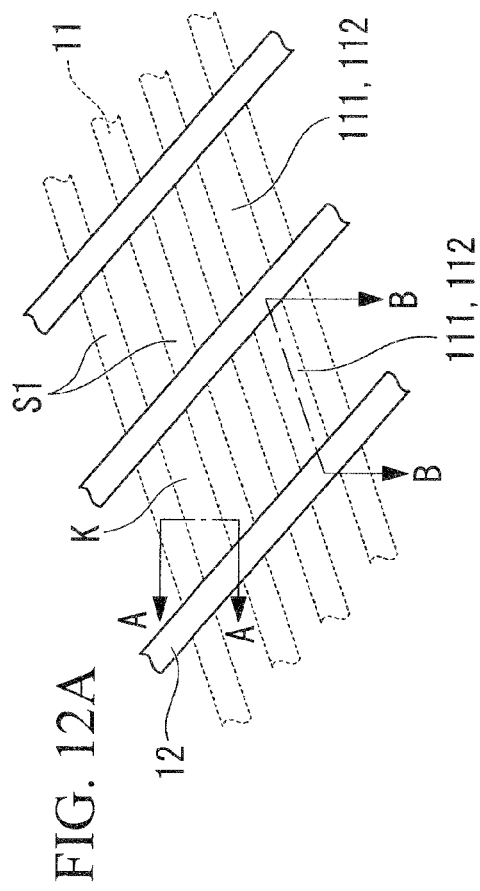
FIG. 12A is a plan view used for explaining an eleventh step of the manufacturing method of the semiconductor device.
Figure 12C:
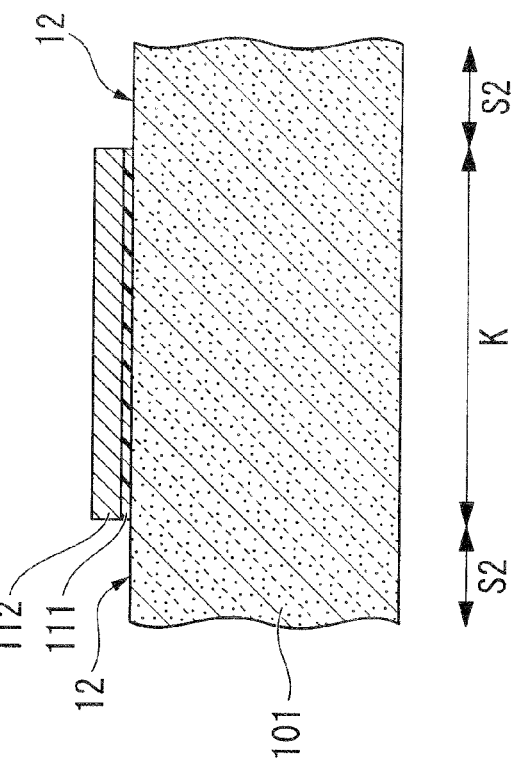
FIG. 12C is a cross-sectional view taken along line B-B in FIG. 12A.
Figure 12B:
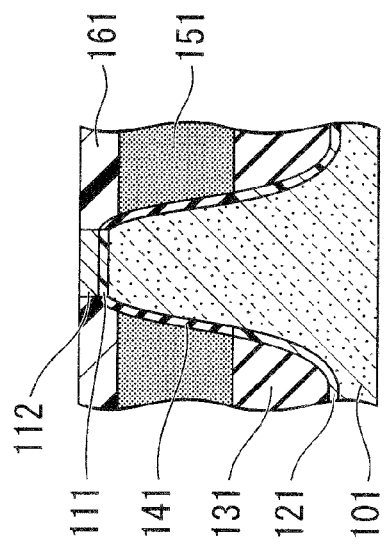
FIG. 12B is a cross-sectional view taken along line A-A in FIG. 12A.

Specifically, as shown in FIGS. 12A to 12C, the silicon nitride film 112 and the silicon oxide film 111 are subjected to patterning and divided into plural sections in longitudinal directions by way of the well-known lithography and dry etching, thus forming slit patterns 12 in correspondence with the second separation regions S2. The slit patterns 12 partially expose the semiconductor substrate 101. It is preferable that an etching value (or an etched depth) applied to the silicon oxide film 111 be set to 15 nm or so in order to leave the silicon oxide film 161 used for the insulation of gate electrodes.

Figure 13A:
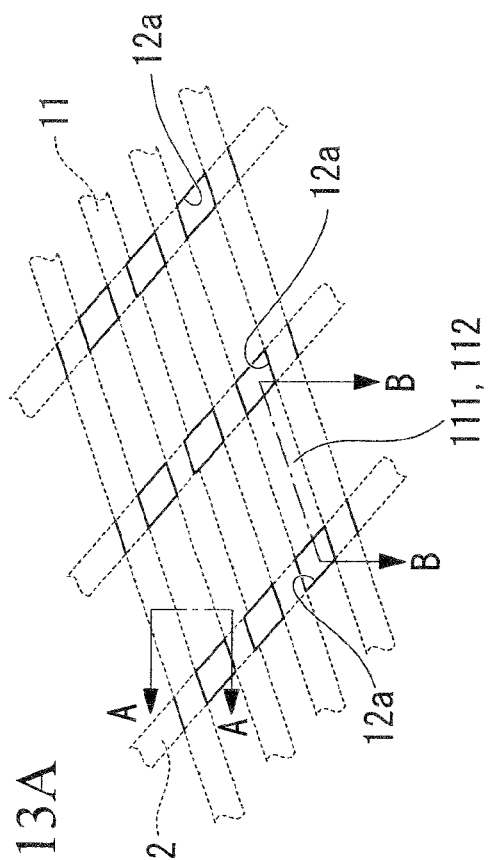
FIG. 13A is a plan view used for explaining a twelfth step of the manufacturing method of the semiconductor device.
Figure 13C:
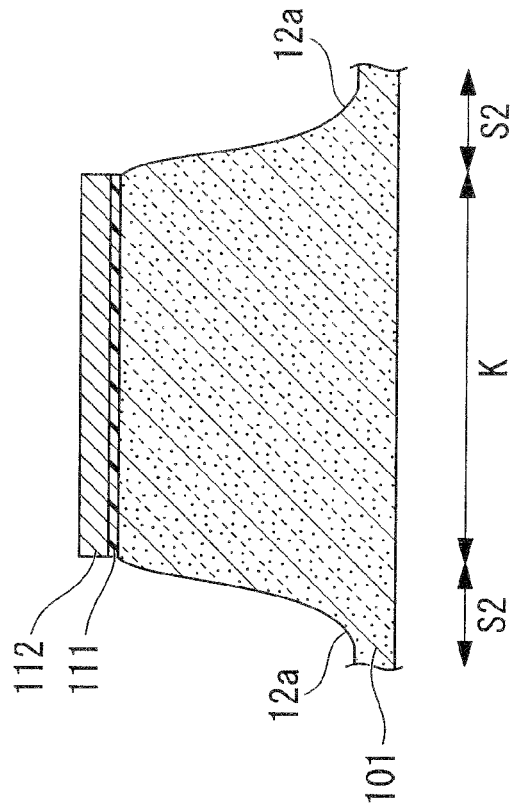
FIG. 13C is a cross-sectional view taken along line B-B in FIG. 13A.
Figure 13B:
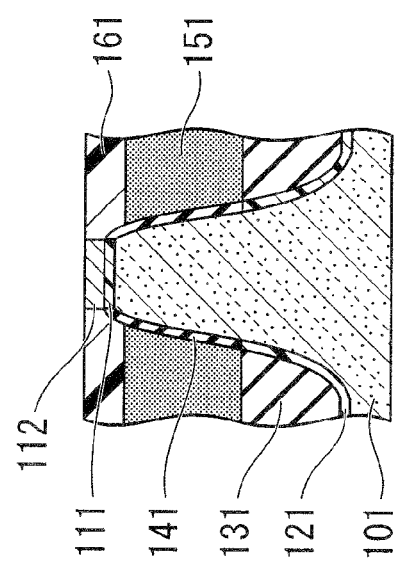
FIG. 13B is a cross-sectional view taken along line A-A in FIG. 13A.

Next, as shown in FIGS. 13A to 13C, the prescribed parts of the semiconductor substrate 101 exposed in the slit patterns 12 are selectively etched using the silicon nitride film 112 as a mask at an etched depth of about 200 nm thus forming second separation trenches 12a serving as the second separation regions S2. The slit patterns 12 expose the prescribed parts of the silicon oxide film 161 used for the insulation of gate electrodes in addition to the prescribed parts of the semiconductor substrate 101. In the step of FIGS. 13A to 13C in which only the prescribed parts of the semiconductor substrate 101 exposed in the slit patterns 12 are selectively etched so as to form the second separation trenches 12a at the selected positions on the opposite sides of the silicon nitride film 112 and the silicon oxide film 111 in their longitudinal directions.

Figure 14A:
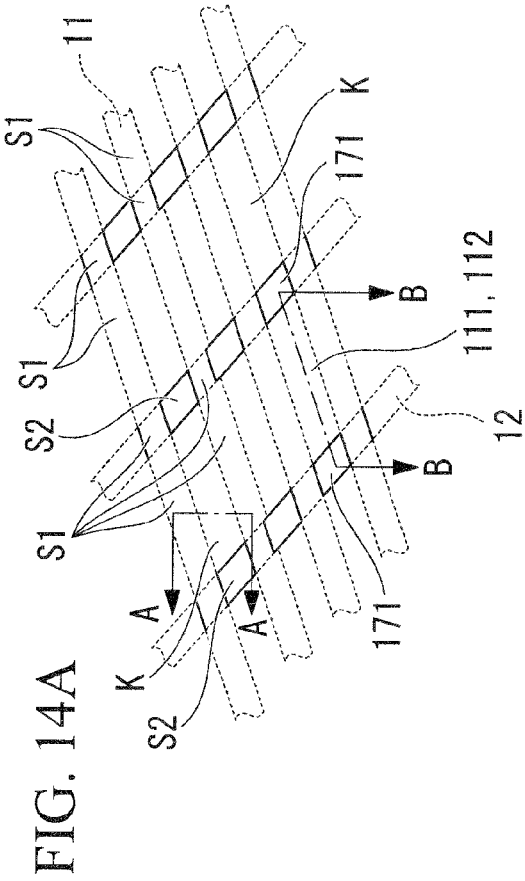
FIG. 14A is a plan view used for explaining a thirteenth step of the manufacturing method of the semiconductor device.
Figure 14C:
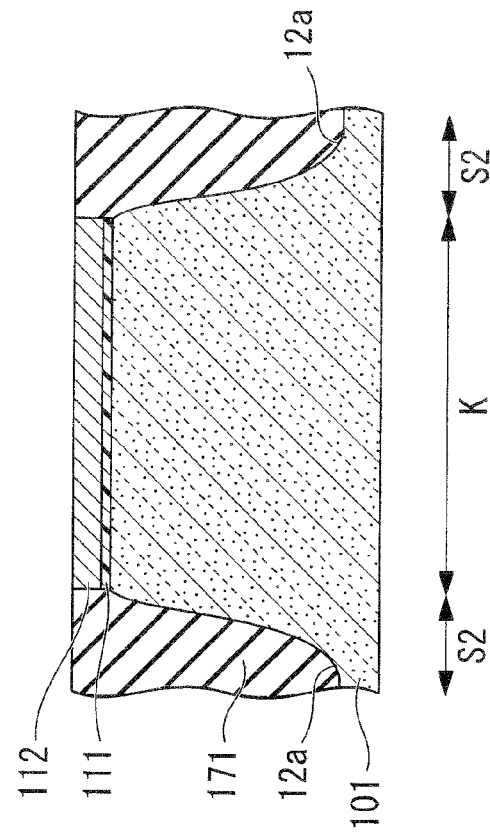
FIG. 14C is a cross-sectional view taken along line B-B in FIG. 14A.
Figure 14B:
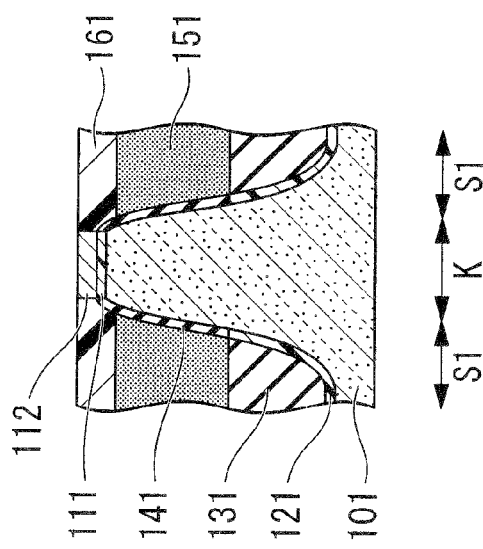
FIG. 14B is a cross-sectional view taken along line A-A in FIG. 14A.

Next, as shown in FIGS. 14A to 14C, a silicon oxide film of a 400 nm thickness is deposited on the entire surface of the semiconductor substrate 101 by way of the well-known HDP-CVD (High-Density Plasma Chemical Vapor Deposition); then, the deposited silicon oxide film is polished and removed using the silicon nitride film 112 as a stopper by way of CMP. In this step, the second separation trenches 12a serving as the second separation regions S2 are each filled with a second separation insulating film 171 composed of silicon oxide. That is, the first separation region S1 extending along the active region K in its longitudinal direction is constituted of at least the first separation insulating film 131 and the first gate electrode 151 which are laminated together. The second separation region S2 extending along the active region K in its width direction except for its prescribed part crossing the first separation region S1 is formed by way of a single-layered film composed of the second separation insulating film 171.

(C) Trench Forming Process

In the trench forming process, the trench 100 is formed in the active region K, while the fin channel regions 185 are formed in the active region K between the trench 100 and the first separation regions S1.

Figure 15A:
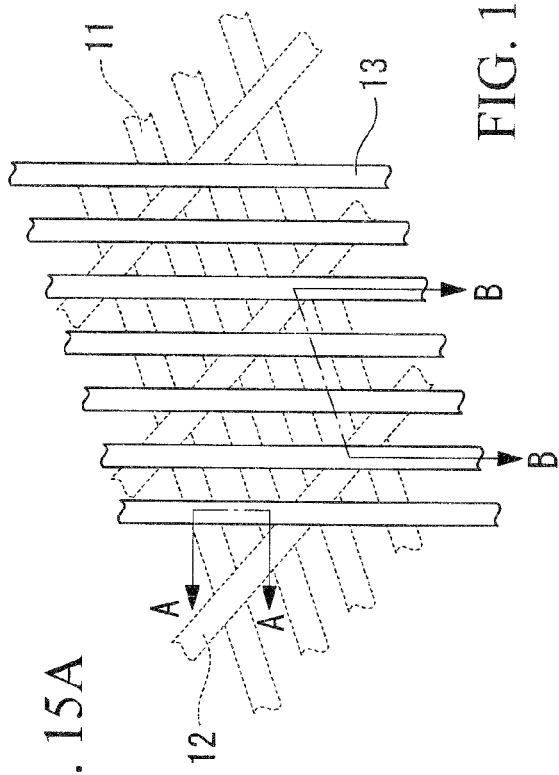
FIG. 15A is a plan view used for explaining a fourteenth step of the manufacturing method of the semiconductor device.
Figure 15C:
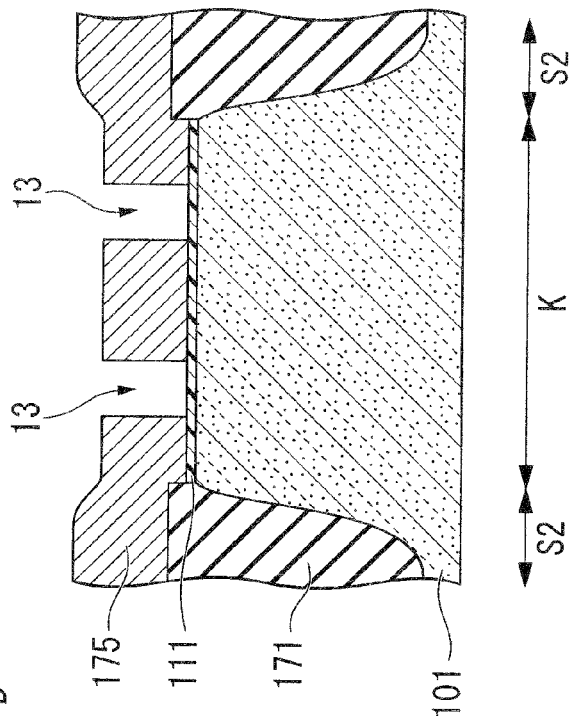
FIG. 15C is a cross-sectional view taken along line B-B in FIG. 15A.
Figure 15B:
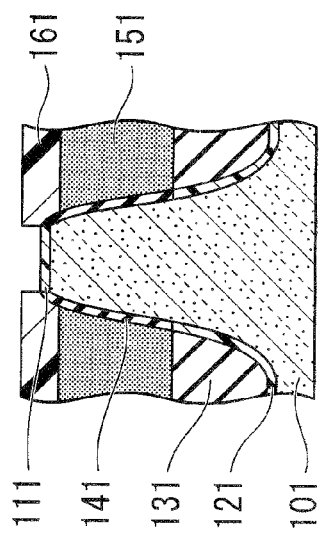
FIG. 15B is a cross-sectional view taken along line A-A in FIG. 15A.

Specifically, as shown in FIGS. 15A to 15C, a warmed phosphoric acid is applied to the silicon oxide film 112, which is thus removed; then, a silicon nitride film 175 of a 100 nm thickness is deposited on the entire surface of the silicon substrate 101 by way of LP-CVD. Subsequently, the silicon nitride film 175 is subjected to patterning by way of the well-known lithography and dry etching, thus forming gate trench patterns 13 in the silicon nitride film 175. The gate trench patterns 13 expose the silicon oxide film 111 on the active region K.

Next, as shown in FIGS. 16A to 16C, the silicon oxide film 111 is etched using the silicon nitride film 175 as a mask at an etched depth of about 10 nm by use of an etching gas (e.g. a mixed gas composed of $CF_4$ and Ar), thus exposing the surface of the semiconductor substrate 101 in the active region K. Then, silicon etching of a high selection ratio is performed on the silicon oxide film 111 by use of a mixed gas composed of $Cl_2$ (chlorine), HBr (hydrogen bromide), and $O_2$ (oxygen), thus forming the first trench 100b whose depth is 80 nm and whose interior surface 100a is substantially perpendicular to the semiconductor substrate 101.

Next, as shown in FIGS. 17A to 17C, thermal oxidation is performed so as to form a silicon oxide film 181 of a 10 nm thickness entirely on the interior surface 100a and the bottom portion of the first trench 100b.

Next, as shown in FIGS. 18A to 18C, anisotropic etching is performed using an etching gas (e.g. a mixed gas composed of $CF_4$ and Ar), thus removing the silicon oxide film 181 from the bottom portion of the first trench 100b.

Next, as shown in FIGS. 19A to 19C, a warmed phosphoric acid is applied to the silicon oxide film 175, which is thus selectively removed.

Next, as shown in FIGS. 20A to 20C, isotropic etching using an aqueous solution including ammonia is performed on the semiconductor substrate 101, so that a silicon portion (i.e. a part of the silicon substrate 101) exposed on the bottom portion of the first trench 100b is etched so as to form the second trench 100d whose cross section taken along line A-A (see FIG. 20B) has a circular interior surface 100c and which communicates with the first trench 100b. The second trench 100d is formed by way of wet etching which is continuously executed so as to partially expose the first gate insulating film 141 on the side surface T1 of the projection T. This makes it possible to form the fin channel regions 185, which are isolated from the semiconductor substrate 101, on the opposite sides of the first trench 100b in the active region K. That is, the fin channel regions 185 are circumscribed by the first trench 100b and the second trench 100d. In addition, the lowermost portions 185a of the fin channel regions 185 are isolated from the semiconductor substrate 101 via the second trench 100d. In this connection, the second trench 100d can be formed by way of CDE (Chemical Dry Etching), for example.

(D) Second Gate Forming Process

In the second gate forming process, the second gate insulating film 191 is formed inside the trench 100, and the second gate electrode 225 is formed and partially embedded in the trench 100.

Specifically, as shown in FIGS. 21A to 21C, the silicon oxide films 111 and 181 are removed using a hydrofluoric (HF) solution; then, a second gate insulating film 191 composed of a silicon oxide film of about a 6 nm thickness is formed on the interior surface of the trench 100. Normally, the second gate insulating film 191 can be formed by way of thermal oxidation. It is preferable to use ISSG (In Situ Steam Generation) oxidation having a high effect for rounding corners.

Next, as shown in FIGS. 22A to 22C, a polysilicon layer 201 of a 80 nm thickness, in which phosphorus is doped at a density of $1 \times 10^{20}/cm^3$, is formed on the entire surface of the semiconductor substrate 101. The polysilicon layer 201 is formed to completely fill the inside of the trench 100. Then, tungsten nitride (WN) of a 5 nm thickness and tungsten (W) of a 70 nm thickness are sequentially deposited on the polysilicon layer 201 thus forming a low-resistance film 211. Subsequently, a cap insulating film 221 of a 140 nm thickness composed of silicon nitride is deposited by way of LP-CVD.

Figure 23A:
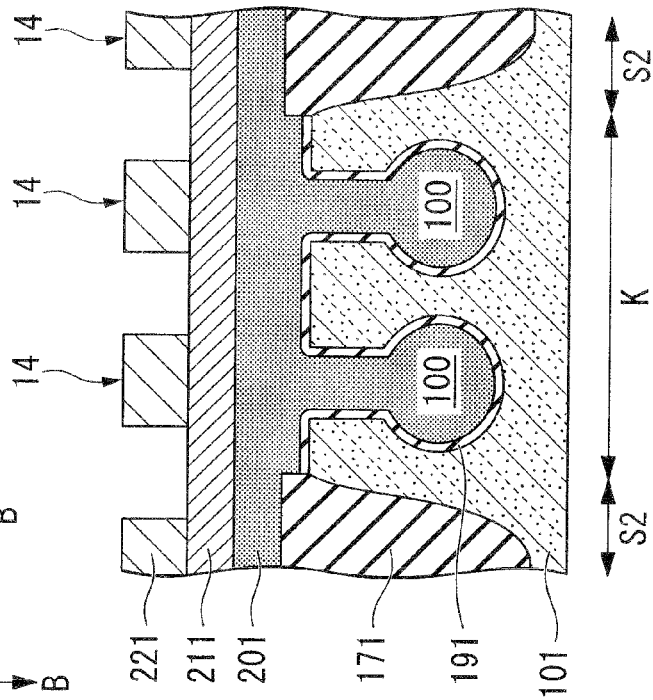
FIG. 23A is a plan view used for explaining a twenty-second step of the manufacturing method of the semiconductor device.
Figure 23C:
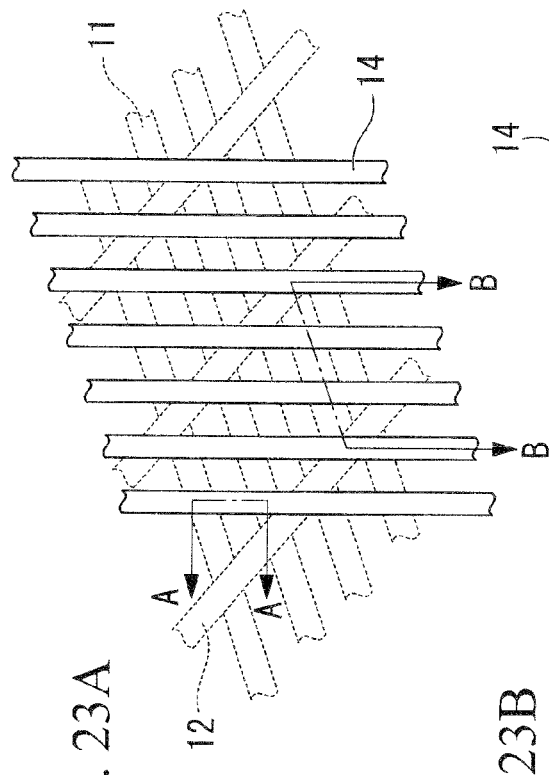
FIG. 23C is a cross-sectional view taken along line B-B in FIG. 23A.
Figure 23B:
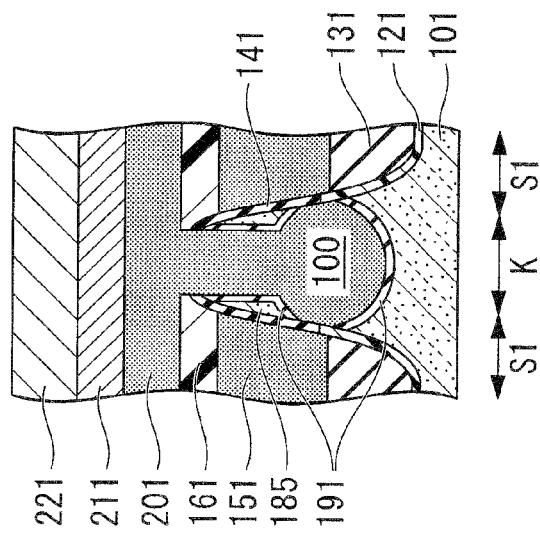
FIG. 23B is a cross-sectional view taken along line A-A in FIG. 23A.

Next, as shown in FIGS. 23A to 23C, the cap insulating film 221 is subjected to patterning by way of the well-known lithography and dry etching, thus forming gate trench patterns 14.

Figure 24A:
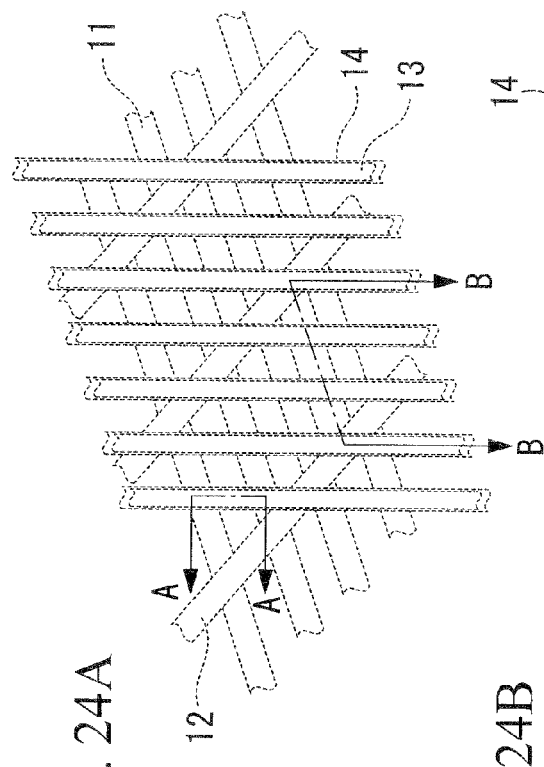
FIG. 24A is a plan view used for explaining a twenty-third step of the manufacturing method of the semiconductor device.
Figure 24C:
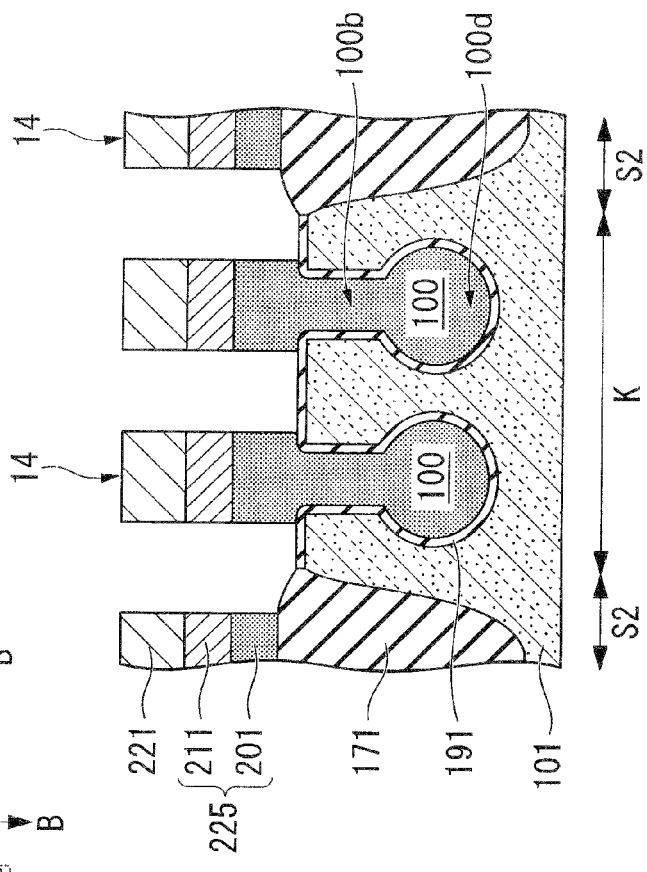
FIG. 24C is a cross-sectional view taken along line B-B in FIG. 24A.
Figure 24B:
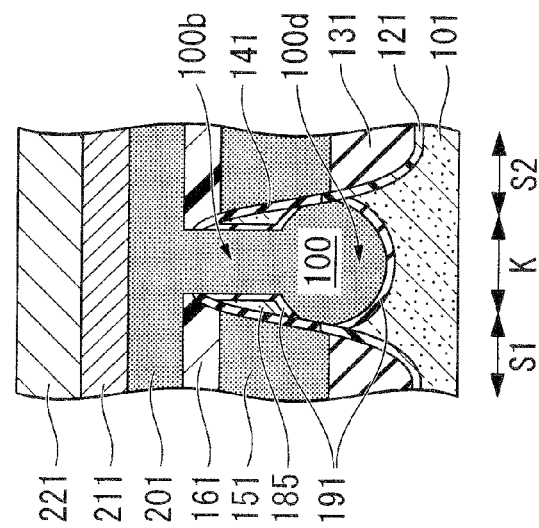
FIG. 24B is a cross-sectional view taken along line A-A in FIG. 24A.

Next, as shown in FIGS. 24A to 24C, dry etching is performed using the cap insulating film 221 as a mask on the low-resistance film 211 and the polysilicon layer 201. In this step, the second gate electrode 225 including the cap insulating film 221 is formed so as to fill the inside of the first trench 100b and the inside of the second trench 100d. As a result, it is possible to produce the following structure.

The first separation regions S1 each laminating the first separation insulating film 131 and the first gate electrode 151 are formed on the opposite sides of the active region K in its width direction. The second trench 100d having a circular shape in cross section is formed to communicate with the lower end of the first trench 100b having a vertically disposed interior surface in the active region K. A pair of fin channel regions 185 each of which is disposed between the first trench 100b and the first gate electrode 151 is formed in the active region K. The low-resistance film 211 and the cap insulating film 221 are sequentially deposited above the trench 100 whose inside is filled with the polysilicon layer 201. The second gate electrode 225 is constituted of the polysilicon layer 201 and the low-resistance film 211. Each fin channel region 185 is disposed in contact with the first gate electrode 151 via the first gate insulating film 141, while it is also disposed in contact with the second gate electrode 225 via the second gate insulating film 191. The silicon oxide films 161 are deposited on the first gate electrodes 151, which are thus insulated from the second gate electrode 225.

(E) Source-Drain Forming Process

In the source-drain forming process, the source-drain diffusion regions 241 are formed on the opposite sides of the trench 100 in the active region K below the second gate electrode 225 in connection with the fin channel regions 185.

Specifically, as shown in FIGS. 25A to 25C, a silicon nitride film 231a of a 25 nm thickness is deposited on the entire surface of the semiconductor substrate 101 by way of LP-CVD.

Next, as shown in FIGS. 26A to 26C, side walls 231 are formed by way of the well-known SAC (Self-Aligned Contact) method, thus forming contact holes 15. The contact holes 15 are formed on the opposite sides of the trench 100 so as to sandwich the second gate electrode 225. Then, ion implantation is performed on the active region K via the contact holes 15 with a phosphorus dose of $1.0 \times 10^{13}/cm^2$ and an acceleration energy of 30 keV, and another ion implantation is performed with an arsenic dose of $1.0 \times 10^{13}/cm^2$ and an acceleration energy of 30 keV. Subsequently, a thermal treatment is performed at a temperature of 900° C. for ten seconds in an inert gas atmosphere such as a nitrogen gas, thus forming the impurity diffusion regions 241 serving as sources and drains.

Next, as shown in FIGS. 27A to 27C, a polysilicon layer of a 80 nm thickness in which phosphorus is doped at a density of $1 \times 10^{20}/cm^3$ is deposited by way of LP-CVD; then, the deposited polysilicon layer is polished and removed using the cap insulating film 221 as a stopper by way of CMP, thus forming contact plugs 251. Thus, it is possible to completely produce the gate-trench MOS transistor Tr in the semiconductor device 1 of the present embodiment.

(F) Semiconductor Memory

Figure 28:
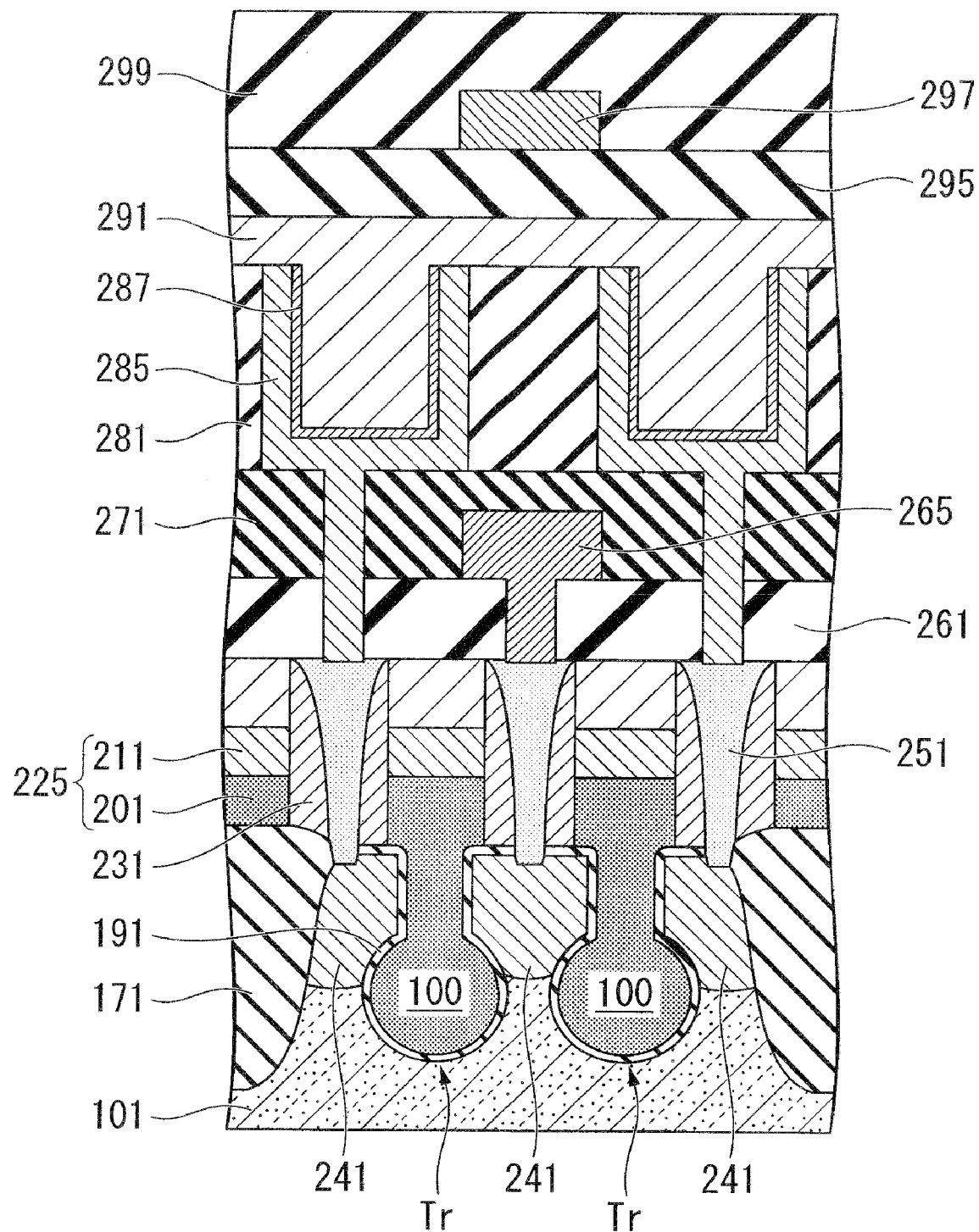
FIG. 28 is a cross-sectional view of a semiconductor memory including trench-gate MOS transistors produced by way of the above manufacturing method.

As shown in FIG. 28, an interlayer insulating film 261 and a bit line 265 are formed by way of well-known methods. Then, interlayer insulating films 271 and 281 are sequentially deposited on the interlayer insulating film 261 and the bit line 265; then, a capacitor composed of a lower electrode 285, an insulating film 287, and an upper electrode 291 is formed in the interlayer insulating film 281. Subsequently, an interlayer insulating film 295 is deposited on the interlayer insulating film 281; then, a wire 297 is formed thereon. Furthermore, an interlayer insulating film 299 is deposited on the interlayer insulating film 295, wherein a multilayered wiring structure is formed as necessary. By way of the aforementioned processes, it is possible to produce a memory cell of a semiconductor memory such as DRAM.

Figure 29:
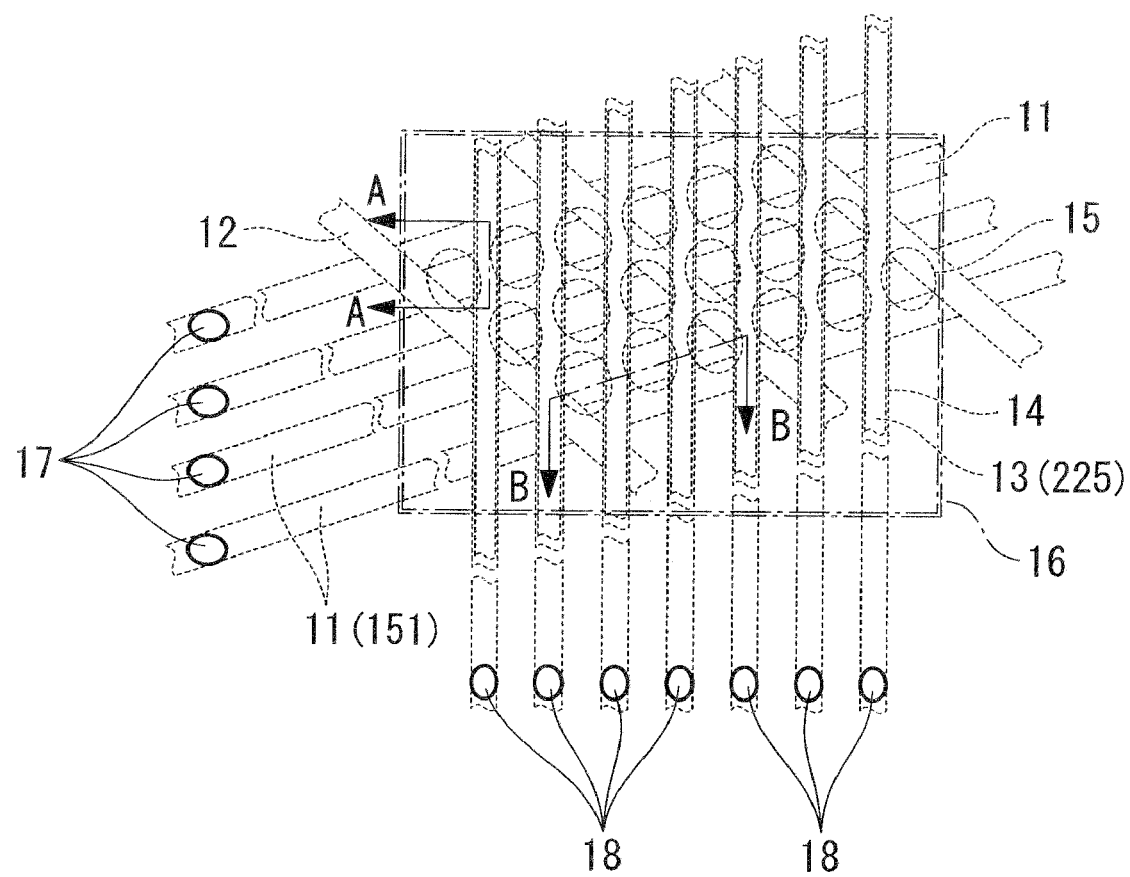
FIG. 29 is a plan view showing the layout of supply contacts aligned externally of a memory cell area.

FIG. 29 is a plan view showing a plurality of supply contacts 17 for supplying voltages to the back-gates (composed of the first gate electrodes 151) and a plurality of supply contacts 18 for supplying voltages to the word lines (composed of the second gate electrodes 225). The present embodiment allows the supply contacts 17 and 18 to be aligned at arbitrary positions externally of memory cell areas 16 circumscribed by dashed lines. Herein, it is possible to form contact plugs using the supply contacts 17 and 18 by way of a well-known technique, wherein these contact plugs are connected to upper wiring layers.

Figure 30:
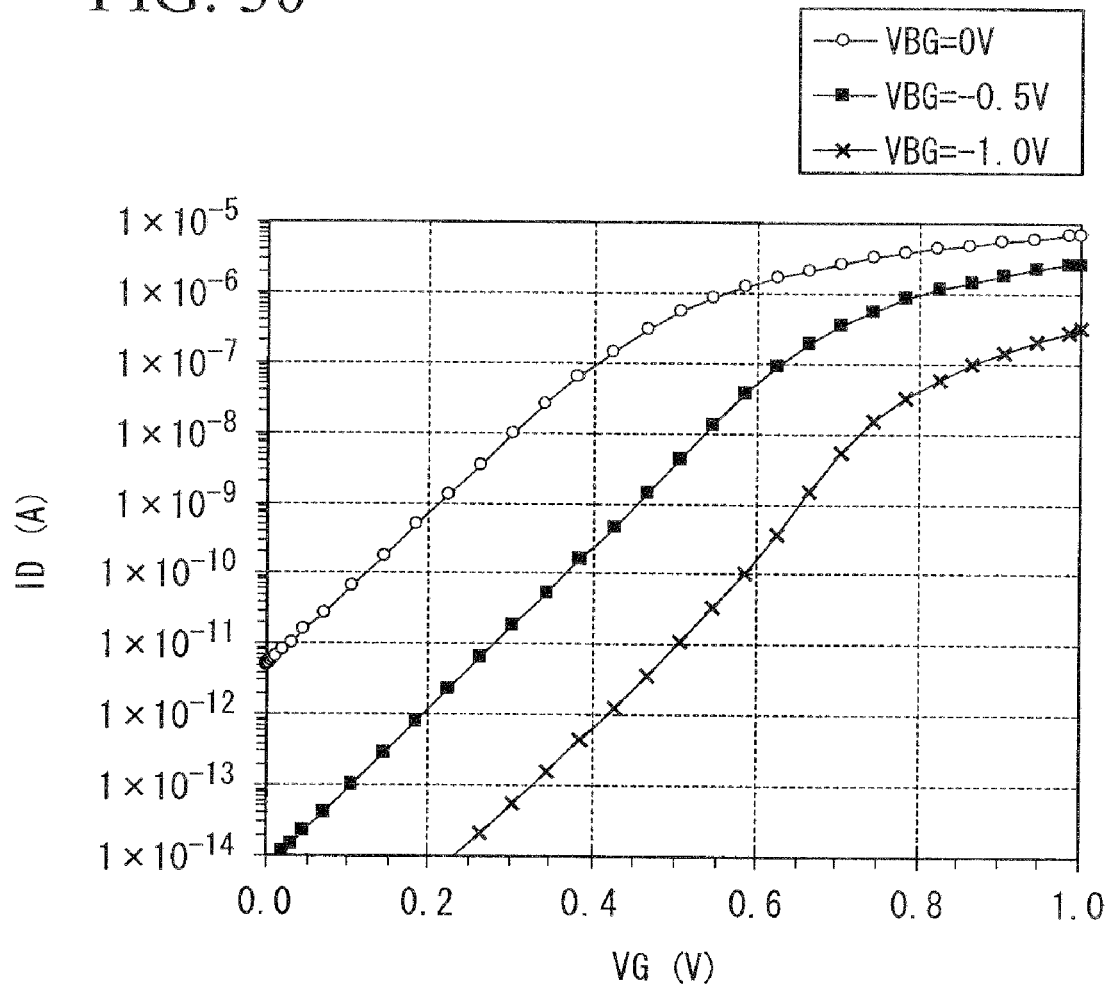
FIG. 30 is a graph showing a trench-gate voltage (VG) dependency of a current (ID) flowing through a fin channel region in the semiconductor device.

FIG. 30 shows a trench-gate voltage (i.e. VG applied to the second gate electrode) dependency of a current (ID) flowing through the fin channel region 185 when a back-gate voltage (i.e. VBG applied to the first gate electrode 151) is set to 0 V, 0.5 V, and 1.0 V in the semiconductor device 1 shown in FIGS. 1A to 1C. It clearly shows that it is possible to achieve a wide-range control of the current-voltage characteristics of the transistor Tr by adjusting the back-gate voltage (VBG) and the trench-gate voltage (VG), thus remarkably improving the degree of freedom in designing the transistor Tr.

Figure 31:
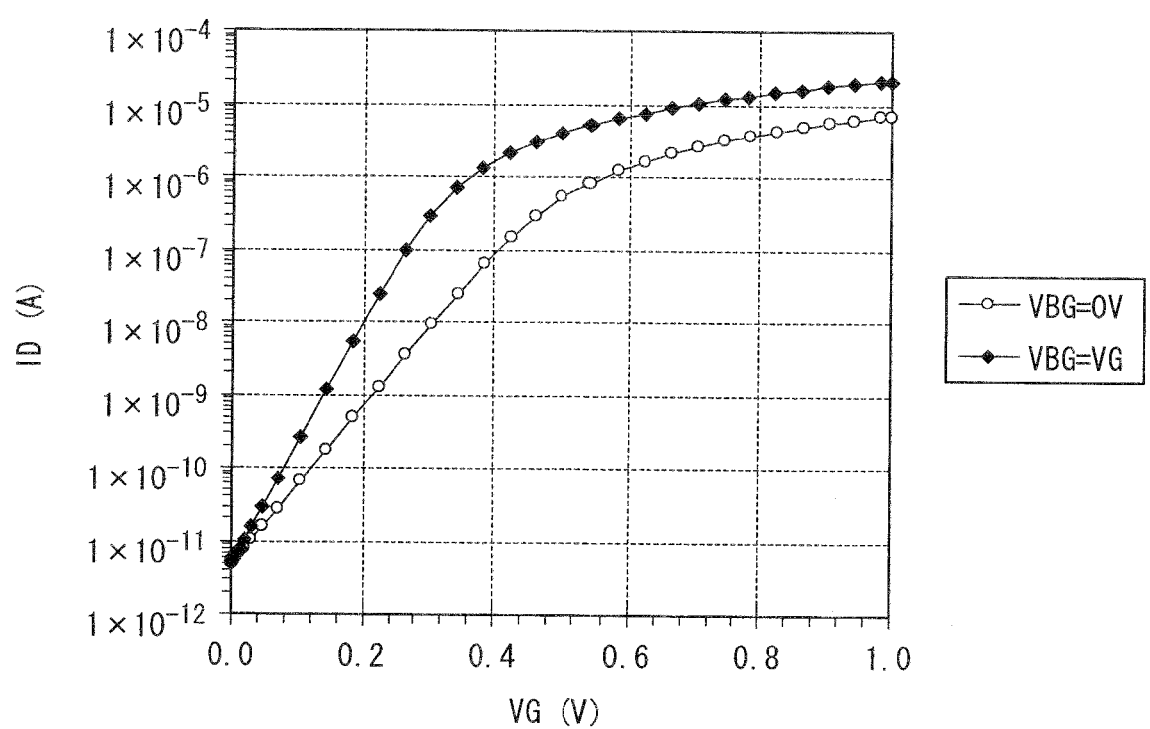
FIG. 31 is a graph showing a trench-gate voltage (VG) dependency of a current (ID) flowing through a fin channel region when sweeping a back gate and a trench gate with the same voltage.

FIG. 31 shows a trench-gate voltage (VG) dependency of a drain current (ID) when sweeping the back gate and the trench gate with the same voltage. It is possible to improve subthreshold characteristics in the operation of VBG=VG compared to the operation of VBG=0 V in which the back-gate voltage (VBG) is fixed to zero. In addition, it is possible to increase the on-current of the transistor Tr; hence, it is possible to demonstrate high performance of the semiconductor device having a fine structure and operating with a low voltage.

In the present embodiment, the back-gate electrode (i.e. the first gate electrode 151) is composed of polysilicon; but this is not a restriction. Similar to the trench-gate electrode (i.e. the second gate electrode 225), it is possible to design the back-gate electrode having a poly-metal structure. This structure is formed by modifying the step of FIGS. 8A to 8C in such a way that a thin polysilicon layer which does not embed the first separation region S1 therein is formed, and then the inside thereof is embedded with a low-resistance film. This reduces the resistance of the back gate as similarly to the trench gate, thus securing high-speed performance.

(G) Variation of Semiconductor Memory

Figure 32:
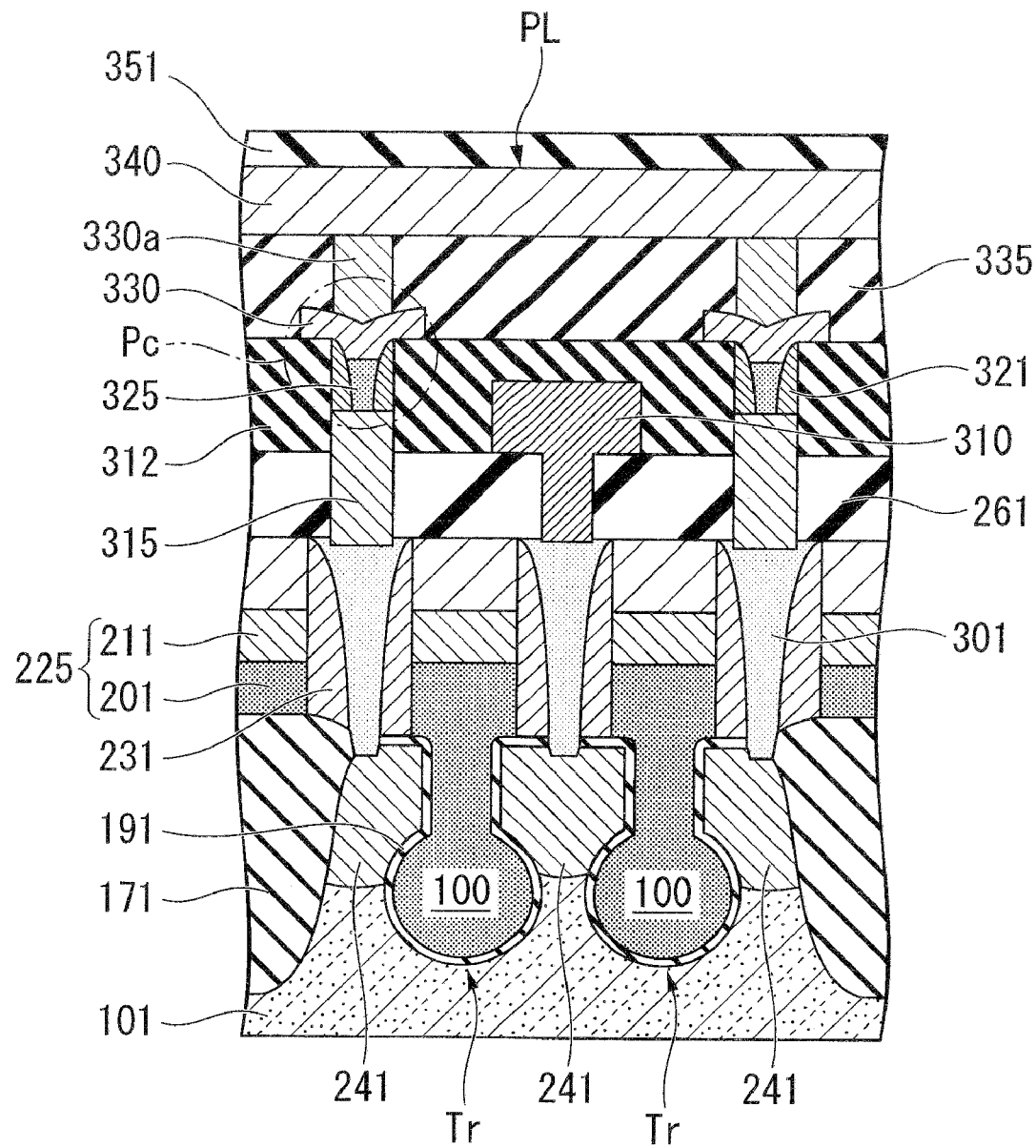
FIG. 32 is a cross-sectional view showing a variation of the semiconductor memory.

FIG. 32 shows the constitution of a semiconductor memory according to a variation of the present embodiment of the present invention.

Compared to the semiconductor memory of FIG. 28, the semiconductor memory of FIG. 32 is designed to use phase-change elements Pc instead of the capacitors for use in memory cells. The semiconductor memory of FIG. 32 is produced in a similar manner to the semiconductor memory of FIG. 28 until the formation of polysilicon plugs shown in FIGS. 26A to 26C; hence, the duplicate description regarding the manufacturing method thereof will be omitted.

The phase-change element Pc is constituted of a lower electrode (or a heater plug) 315 connected to a tungsten plug 301, an upper electrode 330 connected to a reference potential line 340 via a reference potential contact 330a, and a memory layer 325 (which is formed between the lower electrode 315 and the upper electrode 330). In FIG. 32, reference numerals 261, 312, 335, and 351 designate interlayer insulating films. FIG. 32 shows that the memory layer 325 is disposed inside a side wall 321, however, this is not an essential element.

A phase-change material is used for the memory layer 325. The phase-change material is not necessarily limited in specific property as long as it varies the electric resistance thereof due to phase changes occurring between two phase states, wherein it is preferable to use a chalcogenide material which is an alloy including at least one of prescribed elements such as germanium (Ge), antimony (Sb), tellurium (Te), indium (In), and selenium (Se). For instance, it is possible to use binary elements such as GaSb, InSb, InSe, $Sb_2Te_3$, and GeTe, ternary elements such as $Ge_2Sb_2Te_5$, InSbTe, GaSeTe, $SnSb_2Te_4$, and InSbGe, and quaternary elements such as AgInSbTe, (GeSn)SbTe, GeSb(SeTe), and $Te_{81}Ge_{15}Sb_2S_2$. It is preferable for the present embodiment to use $Ge_2Sb_2Te_5$ (GST) as the chalcogenide material adapted to the memory layer 325. The thickness of the memory layer 325 is not necessarily limited to a specific value, but it is limited in a range between 10 nm to 200 nm in the present embodiment. The memory layer 325 is formed by way of sputtering, for example.

The lower electrode 315 is used as a heater plug, which forms a part of a heating member in writing data. The lower electrode 315 is composed of a material having a relatively high electric resistance, wherein it is preferable to use a metal silicide, metal nitride, and metal silicide nitride, for example. No specific limitation is applied to the selection of materials for use in the lower electrode 315; however, it is preferable to use high melting point metals (and their nitrides) such as W, TiN, TaN, WN, and TiAlN, high melting point silicide nitrides such as TiSiN and WSiN, and other materials such as TiCN.

The upper electrode 330 is composed of a high melting point metal such as W and TiN. It is preferable that the reference potential contact 330a be composed of a low thermal conductivity material in order to prevent heat from be easily released due to electrification. Similar to the lower electrode 315, it is preferable for the reference potential contact 330 to use the above materials such as TiAlN, TiSiN, and TiCN.

In the semiconductor memory having the above structure, any one of word lines 225 is activated by a word driver forming a peripheral circuit of a DRAM, wherein a current is forced to flow through at least one of bit lines 310, thus writing or reading data. When the word line 225 is activated so as to turn on the corresponding cell transistor in a memory cell, it is connected to the corresponding bit line 310 via the phase-change element Pc. In this state, when a write current is forced to flow through the bit line 310, it is possible to vary the crystal phase or amorphous phase in the memory layer 325 included in the phase-change element Pc. When a read current is forced to flow through the bit line 310, it is possible to read data from the memory cell because the current value depends on whether the memory layer 325 of the phase-change element Pc has the crystal phase or the amorphous phase.

3. Effects

The semiconductor device 1 according to the present embodiment of the present invention offers the following effects.

(1) In the semiconductor device 1, the fin channel regions 185 are formed in the active region K at prescribed positions between the trench 100 and the first separation regions S1; the second gate electrode 201 serving as the trench-gate electrode 225 is formed above the trench 100; and the first gate electrodes 151 serving as the back-gate electrodes are formed in the first separation regions S1. This makes it possible to operate the trench-gate MOS transistor Tr by applying a certain back-gate voltage, thus improving sub-threshold characteristics and increasing the on-current; hence, it is possible to secure a preferable operation with a fine structure operating at a low voltage.

(2) In the semiconductor device 1, the first separation insulating films 131 are disposed beneath the first gate electrodes 151, and the second separation insulating films 171 are formed in the second separation regions S2. This makes it possible to reliably circumscribe the active region K by the first separation insulating films 131 and the second separation insulating films 171

(3) In the semiconductor device 1, the first gate electrodes 151 are elongated in parallel with the fin channel regions 185 in their longitudinal directions; hence, it is possible to apply the back-gate voltage entirely to the fin channel regions 185.

(4) When the first gate electrodes 151 are composed of metals, they are reduced in resistance, thus ensuring a high-speed performance of the semiconductor device 1.

(5) Since the bottom portions 151a of the first gate electrodes 151 are lower than the lowermost portions 185a of the fin channel regions 185, it is possible to apply the back-gate voltage entirely to the fin channel regions 185.

(6) In the semiconductor device 1, the fin channel regions 185 are circumscribed by the first trench 100b and the second trench 100d so that the lowermost portions 185a thereof are isolated from the semiconductor substrate 101 via the second trench 100d. When the potential difference between the second gate electrode 225 and the source-drain diffusion region 241 exceeds a prescribed threshold value, it allows a current to flow through the fin channel region 185 but it does not allow or becomes difficult to flow in the semiconductor substrate 101. This reduces the parasitic capacitance of the second gate electrode 225, thus securing high-speed performance of the semiconductor device 1. Since the fin channel regions 185 completely serve as depletion layers during the operation of the semiconductor device 1, it is possible to form channels having SOI structures without using an expensive SOI substrate.

(7) By use of a pair of fin channel regions 185 disposed on the opposite sides of the active region K in its width direction via the trench 100, it is possible to form a double-gate fin-shaped FET in the semiconductor device 1.

(8) The semiconductor device 1 is adapted to the semiconductor memory including a memory element connected with the trench-gate MOS transistor Tr, thus achieving a fine structure operating at a low voltage.

(9) When the semiconductor device 1 is redesigned to use capacitors as memory elements, it is possible to form a DRAM having a fine structure operating at a low voltage. When the semiconductor device 1 is redesigned to use phase-change elements as memory elements, it is possible to form a phase-change nonvolatile memory (PPRAM) having a fine structure operating at a low voltage.

The manufacturing method of the semiconductor device 1 according to the present embodiment of the present invention offers the following effects.

(1) In the manufacturing method, the first gate insulating films 131 and the first gate electrodes 151 are formed for the purpose of the formation of the first separation regions S1, while the fin channel regions 185 are circumscribed between the trench 100 and the first separation regions S1 in the active region K. Thus, it is possible to manufacture the semiconductor device 1 in which the first gate electrodes 151 serve as the back-gates for the fin channel regions 185.

(2) In the manufacturing method, the first separation insulating films 131 are formed in the first separation trenches 11a; the first gate insulating films 141 are formed on the side surface T1 of the projection T; and the first gate electrodes 151 are formed in connection with the first gate insulating films 141. This make it possible to form the first gate electrodes 151 serving as the back-gates while simultaneously circumscribing the active region K by the first separation regions S1.

(3) Since the bottom portions 151a of the first gate electrodes 151 are lower than the lowermost portions 185a of the fin channel regions 185, it is possible to apply a back-gate voltage entirely to the fin channel regions 185.

(4) Since the first trench 100b and the second trench 100d are formed simultaneously with the fin channel regions 185, which are thus separated from the semiconductor substrate 101, it is possible to easily form channels having SOI structures.

Although the present embodiment is described with respect to the semiconductor device 1 and its manufacturing method, the present invention is not necessarily limited to the present embodiment, wherein the shapes, constitutions, and combinations of parts as well as the layouts of conductive plugs and wirings are illustrative and not restrictive, hence, they can be arbitrarily modified based on specifications and requirements within the scope of the invention, 4. Data Processing System Next, a data processing system and a semiconductor memory having the structure of the aforementioned semiconductor device will be described in detail. The data processing system is directed to a computer system; but this is not a restriction.

Figure 33:
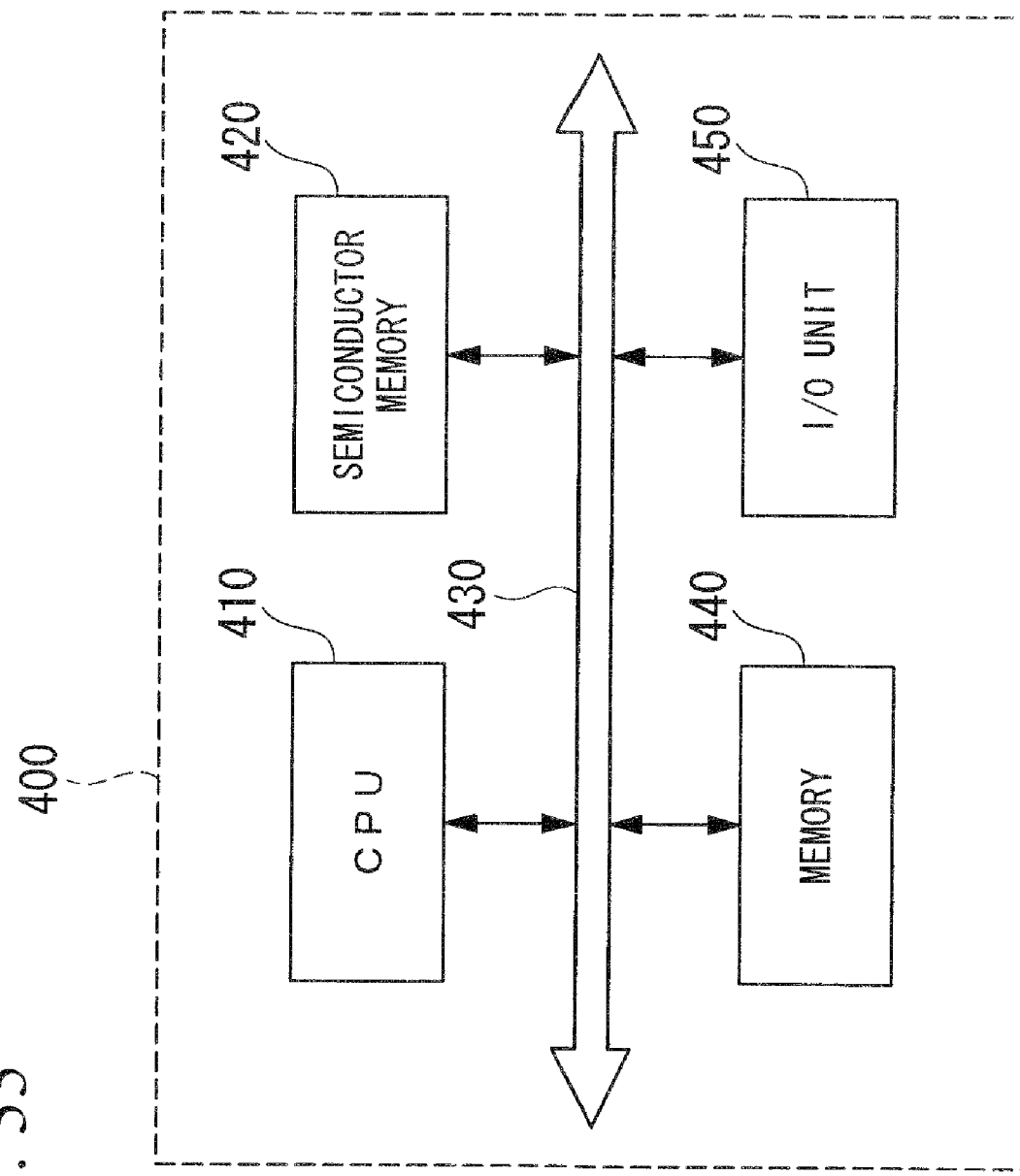
FIG. 33 is a block diagram showing the outline of a data processing system using a semiconductor memory according to the present invention.

FIG. 33 shows the constitution of a data processing system 400, which includes a central processing unit (CPU) 410 and a semiconductor memory 420. In FIG. 33, the CPU 410 is connected to the semiconductor memory 420 via a system bus 430, which can be replaced with a local bus, for example. For the sake of simplification of FIG. 33, the CPU 410 and the semiconductor memory 420 are coupled together via a single system bus 430, which can be replaced with serial lines or parallel lines using connectors. It is possible for the data processing system 400 to use a memory device 440 (which differs from the semiconductor memory 420) and an input/output (I/O) unit 450 in connection with the system bus 430.

The input/output unit 450 may embrace a display such as a liquid-crystal display, while the memory device 440 may embrace a hard-disk drive and MO drive; but this is not a restriction. It is possible to install only an input unit or an output unit in the input/output unit 450. The semiconductor memory 420 serves as a random-access memory (RAM) or a read-only memory (ROM). Specifically, the semiconductor memory 420 serves as digital storage media such as flash memories (composed of semiconductor elements) and dynamic random-access memory (DRAM) such as static random-access memory (SRAM), synchronous dynamic random-access memory (SDRAM), double-data-rate synchronous dynamic random-access memory (DDR-SDRAM), double-data-rate-2 synchronous dynamic random-access memory (DDR2-SDRAM), and double-data-rate-3 synchronous dynamic random-access memory (DDR3-SDRAM). For the sake of simplification of FIG. 33, single components are illustrated with respect to the semiconductor memory 420 and the like; but this is not a restriction. It is possible to incorporate plural components of the semiconductor memory 420 and the like in the data processing system 400.

Figure 34:
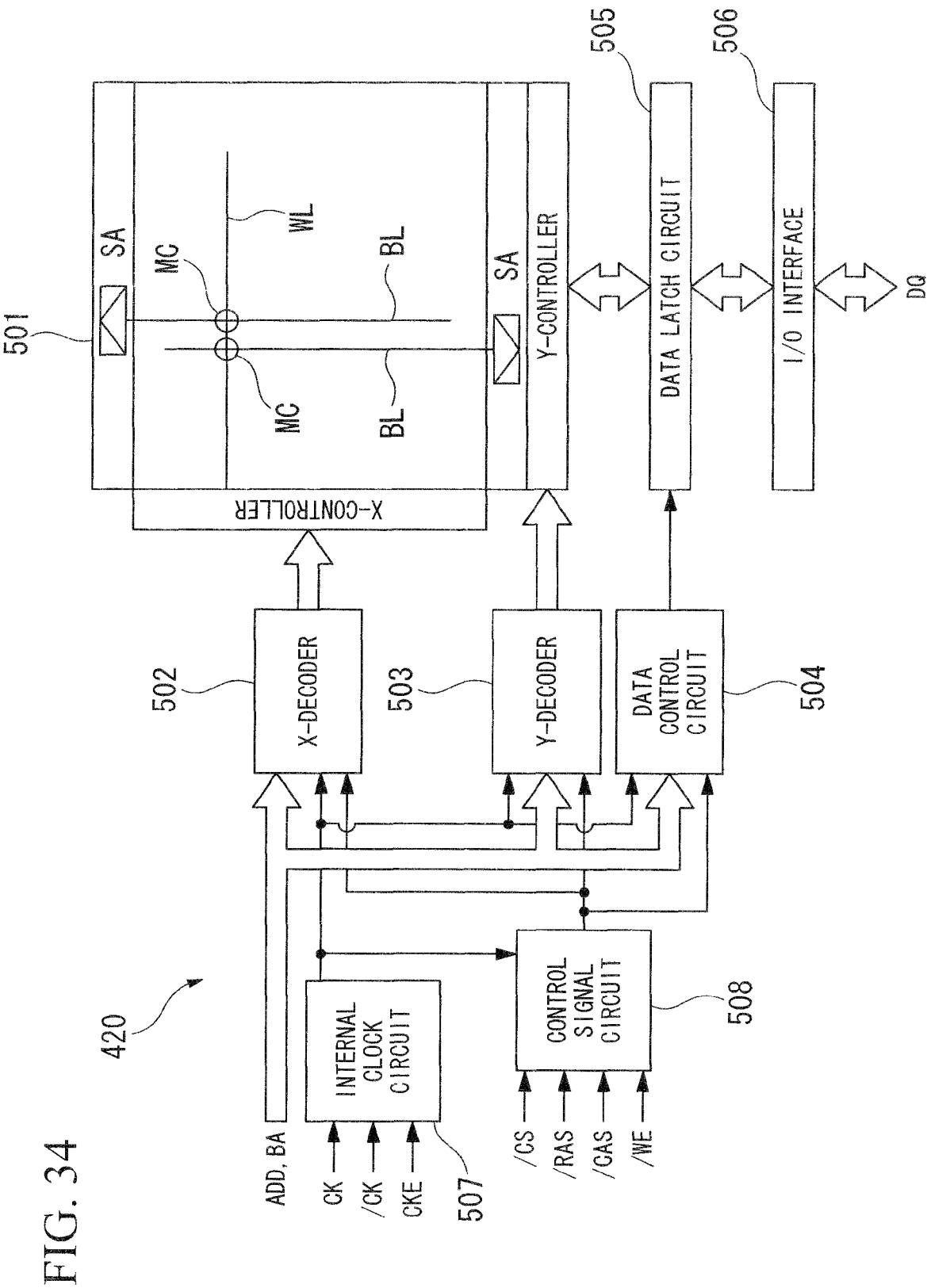
FIG. 34 is a block diagram showing the constitution of the semiconductor memory shown in FIG. 33.

FIG. 34 shows the detailed constitution of the semiconductor memory 420, which is constituted of a memory array 501, an X-decoder 502, a Y-decoder 503, a data control circuit 504, a data latch circuit 505, an input/output (I/O) interface 506, an internal clock (CLK) circuit 507, and a control signal circuit 508

The memory array 501 is constituted of a plurality of word lines WL, a plurality of bit lines BL, and a plurality of sense amplifiers SA, wherein a plurality of memory cells MC is interconnected at a plurality of intersecting points lying between the word lines WL and the bit lines BL.

The memory array 501, the data latch circuit 505, and the I/O interface 506 are connected together via a data transfer bus. The data control circuit 504 control data transfer in the data latch circuit 505. The X-decoder 502 and the Y-decoder 503 control data read/write operations on the memory cells MC in the memory array 501. The internal clock circuit 507 inputs signals CK, /CK, and CKE (Clock Enable) so as to generate clock signals for use in the control signal circuit 508, the X-decoder 502, the Y-decoder 503, and the data control circuit 504. Based on input signals /CS (Chip Select), /RAS (Row Address Strobe), /CAS (Column Address Strobe), and /WE (Write Enable), the control signal circuit 508 generates control signals for controlling the X-decoder 502 and the Y-decoder 503. In the above, symbol "/" indicates low-level activation.

A plurality of memory cells MC is disposed at a plurality of intersecting points between the word lines WL and the bit lines BL. Each memory cell MC is constituted of a transistor and a capacitor or a phase-change element for storing data. The gate of the transistor is connected to the word line WL; one of the drain and source thereof is connected to the bit line BL, while the other is connected to the capacitor or phase-change element. The sense amplifier SA amplifies data which are read onto the bit line BL from the capacitor or phase-change element.

At least a part of the memory cell MC and the sense amplifier SA as well as an X-controller and a Y-controller included in the memory array 501 are formed using the semiconductor device of the present embodiment. In particular, it is preferable to use the trench-gate MOS transistor Tr as the transistor forming the memory cell MC or the sense amplifier SA. Since the trench-gate MOS transistor Tr has a vertical SOI channel region, it is possible to reduce a substrate bias effect, to reduce a short-channel effect, and to improve sub-threshold characteristics. The semiconductor device of the present embodiment is capable of achieving a high-speed switching operation of the transistor Tr irrespective of a low supply voltage, thus achieving high-speed performance of the data processing system 400. The semiconductor device of the present embodiment is capable of adjusting the threshold value of the transistor Tr by adjusting the gate voltage applied to the first gate; this makes it possible to simplify the circuit configuration.

Since the recent technological climate requires electronic devices to operate with low voltages, various technologies have been developed to produce various electronic devices having semiconductor devices operating with low voltages. It is required that portable electronic devices such as cellular phones and digital audio players be shaped in small sizes operating at low voltages with long lifetimes of batteries. Accordingly, data processing systems incorporated in electronic devices should be designed with small sizes operating at low voltages. The transistor Tr adapted to the data processing system 400 has two channel regions so as to form a double-gate-electrode Fin-FET, which can reduce the overall size of an electronic device (incorporating the data processing system) operating at a low voltage. Thus, the present embodiment can offer data processing systems and electronic devices realizing high-speed responses, high-speed processing, and high performance.

The aforementioned matters can be repeated with respect to the semiconductor device of the present embodiment, which is applied to the X-decoder 502, the Y-decoder 503, the data control circuit 504, the data latch circuit 505, and the I/O interface 506 and which is applied to the CPU 410, the memory device 440, and the I/O unit 450 as well. The overall size and drive performance of the data processing system 400 depend upon the size and drive performance of each individual transistor; hence, by adopting the semiconductor device of the present embodiment as transistors, it is possible to achieve the data processing system 400 having small size and high performance.

Lastly, it is apparent that the present invention is not limited to the above embodiment and its variations, but may be modified and changed without departing from the scope and spirit of the invention.

5. Industrial Applicability

The present invention can be applied to various types of semiconductor devices using memories. Of course, the present invention can be applied to various semiconductor memories such as DRAM, RAM, and ROM.

What is claimed is:

1. A semiconductor device including a trench-gate MOS transistor formed on a semiconductor substrate, comprising:
an active region circumscribed by at least one separation region in the semiconductor substrate;
a trench which is formed in the active region for use in the trench-gate MOS transistor;
a fin channel region formed between the trench and the separation region in the active region;
a first gate electrode which is embedded in the separation region in connection with the fin channel region via a first gate insulating film;
a second gate electrode which is embedded in the trench in connection with the fin channel region via a second gate insulating film; and
a source-drain diffusion region which is disposed beside the trench in the active region below the second gate electrode in connection with the fin channel region.

2. The semiconductor device according to claim 1, wherein the separation region is constituted of a separation insulating film disposed below the first gate electrode on the semiconductor substrate.

3. The semiconductor device according to claim 1, wherein the first gate electrode is elongated in parallel with the fin channel region in its longitudinal direction.

4. The semiconductor device according to claim 1, wherein the first gate electrode includes at least a metal.

5. The semiconductor device according to claim 1, wherein a bottom portion of the first gate electrode is lower than a lowermost portion of the fin channel region.

6. The semiconductor device according to claim 1, wherein the trench is constituted of a first trench whose interior surface is perpendicular to the semiconductor substrate and a second trench having a circular interior surface which is disposed below to communicate with the first trench, and wherein the fin channel region is circumscribed by the first trench and the second trench so that a lowermost portion thereof is isolated from the semiconductor substrate by the second trench.

7. The semiconductor device according to claim 1, wherein the fin channel region is disposed on each of opposite sides of the trench in its width direction in the active region.

8. The semiconductor device according to claim 1, wherein in the trench-gate MOS transistor is connected with a memory element.

9. The semiconductor device according to claim 8, wherein the memory element is a capacitor.

10. The semiconductor device according to claim 8, wherein the memory element is a phase-change element.

11. A data processing system including a semiconductor device including a trench-gate MOS transistor formed on a semiconductor substrate, wherein the semiconductor device includes an active region circumscribed by at least one separation region in the semiconductor substrate, a trench which is formed in the active region for use in the trench-gate MOS transistor, a fin channel region formed between the trench and the separation region in the active region, a first gate electrode which is embedded in the separation region in connection with the fin channel region via a first gate insulating film, a second gate electrode which is embedded in the trench in connection with the fin channel region via a second gate insulating film, and a source-drain diffusion region which is disposed beside the trench in the active region below the second gate electrode in connection with the fin channel region.

* * * * *